(12) United States Patent
Cha et al.

(10) Patent No.: US 11,104,834 B2
(45) Date of Patent: Aug. 31, 2021

(54) HEAT DISSIPATION SHEET

(71) Applicant: TEIJIN LIMITED, Osaka (JP)

(72) Inventors: Guemju Cha, Osaka (JP); Shinya Komura, Osaka (JP); Takahiro Daido, Osaka (JP)

(73) Assignee: TEIJIN LIMITED, Osaka (JP)

( * ) Notice: Subject to any disclaimer, the term of this patent is extended or adjusted under 35 U.S.C. 154(b) by 0 days.

(21) Appl. No.: 16/337,229

(22) PCT Filed: Sep. 28, 2017

(86) PCT No.: PCT/JP2017/035119
§ 371 (c)(1),
(2) Date: Mar. 27, 2019

(87) PCT Pub. No.: WO2018/062352
PCT Pub. Date: Apr. 5, 2018

(65) Prior Publication Data
US 2019/0300771 A1    Oct. 3, 2019

(30) Foreign Application Priority Data

Sep. 28, 2016 (JP) .................................. 2016-189720
Nov. 21, 2016 (JP) .................................. 2016-225832

(51) Int. Cl.
*C09K 5/14* (2006.01)
*C08K 3/04* (2006.01)
(Continued)

(52) U.S. Cl.
CPC ................. *C09K 5/14* (2013.01); *C08J 5/042* (2013.01); *C08J 5/18* (2013.01); *C08K 3/04* (2013.01);
(Continued)

(58) Field of Classification Search
CPC ...... C09K 5/14; C08L 101/00; H01L 23/3737; H01L 23/373; H01L 23/3733; C08J 5/18;
(Continued)

(56) References Cited

U.S. PATENT DOCUMENTS

2003/0096104 A1* 5/2003 Tobita ..................... C08K 7/24
428/332
2007/0284366 A1* 12/2007 Ohta ..................... H01L 23/373
219/553
(Continued)

FOREIGN PATENT DOCUMENTS

EP      0481762 A2 * 4/1992 ............. D01F 9/145
JP      2008-303324 A    12/2008
(Continued)

OTHER PUBLICATIONS

Espacenet Translation of JP-2008303324-A (Year: 2020).*
International Search Report for PCT/JP2017/035119, dated Nov. 14, 2017.

*Primary Examiner* — Michael Zhang
(74) *Attorney, Agent, or Firm* — Sughrue Mion, PLLC

(57) ABSTRACT

The present invention provides a heat dissipation sheet comprising fibrous carbon and a polymer, wherein: the fibrous carbon has an average effective fiber length of 5-120 μm, an average fiber diameter of 200-900 nm, and an average aspect ratio of 30-10,000; and the heat dissipation sheet has a fibrous carbon content of 5-85% by mass with respect to the total amount of the fibrous carbon and the polymer.

15 Claims, 2 Drawing Sheets

(51) Int. Cl.
*C08J 5/04* (2006.01)
*C08K 3/22* (2006.01)
*C08K 3/36* (2006.01)
*C08K 7/06* (2006.01)
*C08K 7/24* (2006.01)
*H05K 7/20* (2006.01)
*H01L 23/373* (2006.01)
*C08J 5/18* (2006.01)
*C08L 101/00* (2006.01)

(52) U.S. Cl.
CPC ............... *C08K 3/041* (2017.05); *C08K 3/22* (2013.01); *C08K 3/36* (2013.01); *C08K 7/06* (2013.01); *C08K 7/24* (2013.01); *C08L 101/00* (2013.01); *H01L 23/373* (2013.01); *H01L 23/3733* (2013.01); *H01L 23/3737* (2013.01); *H05K 7/20* (2013.01); *C08J 2377/00* (2013.01); *C08K 2003/2227* (2013.01); *C08K 2201/001* (2013.01); *C08K 2201/003* (2013.01); *C08K 2201/004* (2013.01); *C08K 2201/005* (2013.01); *C08K 2201/011* (2013.01); *C08K 2201/016* (2013.01)

(58) Field of Classification Search
CPC ......... C08J 5/042; C08J 2377/00; H05K 7/20; C08K 7/24; C08K 7/06; C08K 3/36; C08K 3/22; C08K 3/04; C08K 3/041; C08K 2201/016; C08K 2201/011; C08K 2201/005; C08K 2201/004; C08K 2201/003; C08K 2201/001; C08K 2003/2227
See application file for complete search history.

(56) References Cited

U.S. PATENT DOCUMENTS

| | | | | |
|---|---|---|---|---|
| 2018/0231337 A1* | 8/2018 | Ito | ............ | B29B 7/005 |
| 2019/0035712 A1* | 1/2019 | Kanaya | ............ | C08K 9/04 |

FOREIGN PATENT DOCUMENTS

| | | | | |
|---|---|---|---|---|
| JP | 2008303324 A | * | 12/2008 | |
| JP | 2009-132810 A | | 6/2009 | |
| JP | 2011-165792 A | | 8/2011 | |
| JP | 2012-122082 A | | 6/2012 | |
| JP | 2013-38179 A | | 2/2013 | |
| JP | 2015-29071 A | | 2/2015 | |

* cited by examiner

[Fig.1]
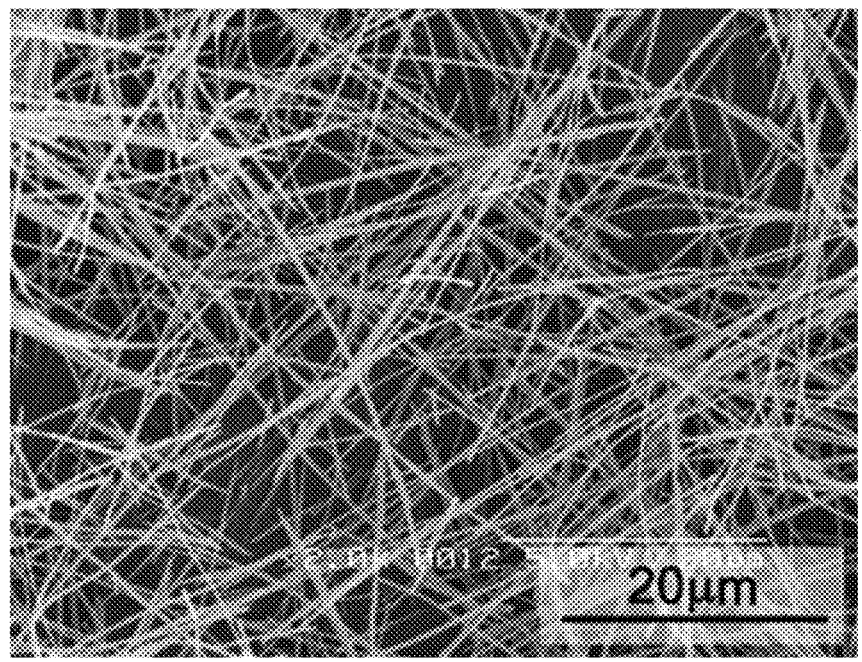
[Fig.2]
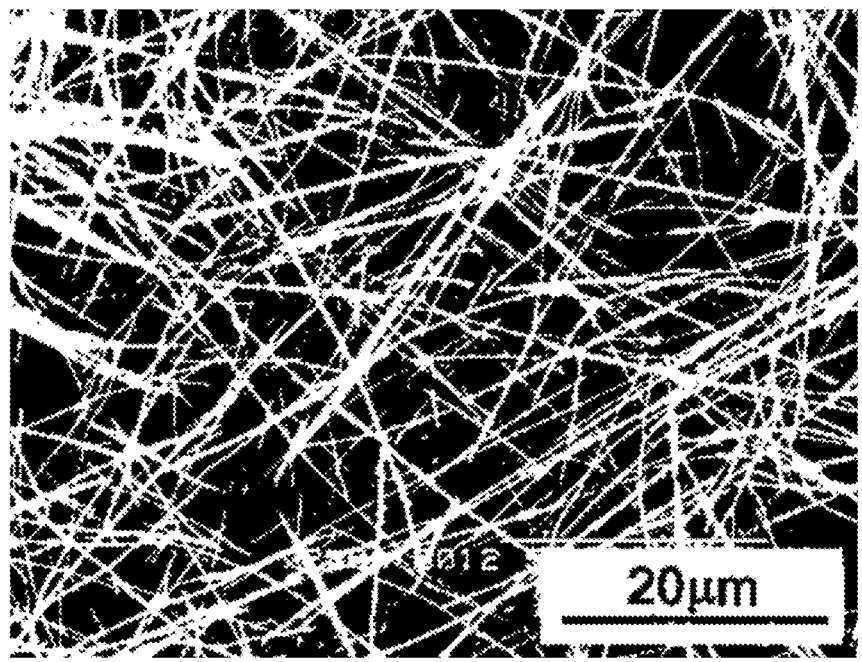

[Fig.3]
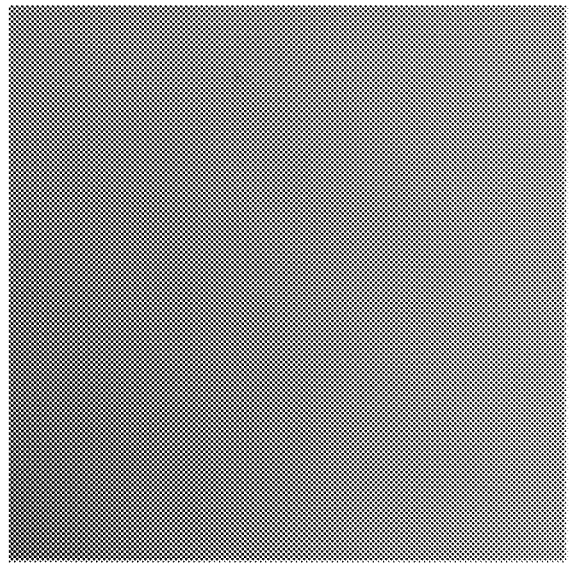
[Fig.4]
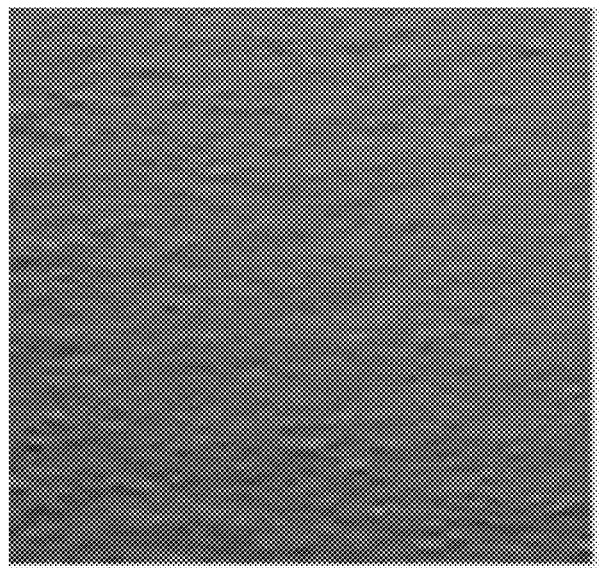

HEAT DISSIPATION SHEET

CROSS REFERENCE TO RELATED APPLICATIONS

This application is a National Stage of International Application No. PCT/JP2017/035119 filed Sep. 28, 2017, claiming priority based on Japanese Patent Application No. 2016-189720 filed Sep. 28, 2016 and Japanese Patent Application No. 2016-225832 filed Nov. 21, 2016.

TECHNICAL FIELD

The present invention relates to a heat dissipation sheet. More specifically, the present invention relates to a heat dissipation sheet containing fibrous carbon and having excellent thermal conductivity.

BACKGROUND ART

Carbon nanomaterials, especially, fibrous carbon with an average fiber diameter of 1 µm or less, have excellent properties such as high crystallinity, high electroconductivity, high strength, a high elastic modulus and light weight, and are therefore used as nanofillers of high-performance composite materials. The application thereof is not limited to reinforcing nanofillers intended for improvement of mechanical strength, and by making use of high electroconductivity of a carbon material, an attempt has been made to use these carbon nanomaterials as materials to be added to electrodes in various kinds of batteries and capacitors, electromagnetic wave shielding materials, electroconductive nanofillers for antistatic materials, or nanofillers to be blended in electrostatic paints for resins. In addition, these carbon nanomaterials are expected to be used as electric field electron emission materials for flat displays and the like, by taking advantage of characteristics with regard to chemical stability, thermal stability and microstructures as fibrous carbon. In addition, application as a heat dissipation material that makes use of high thermal conductivity is greatly expected.

Patent Literature 1 describes a sheet-like thermally conductive molded body with a thickness of 100 to 3000 µm containing a pitch-based carbon fiber filler with an average fiber diameter of 2 to 20 µm and a thermoplastic resin and/or a thermosetting resin. The crystal size (La) derived from a growth direction of a hexagonal net surface is 20 nm or more (70 nm in Example 1), and crystallinity is also excellent.

However, it could not be said that this pitch-based carbon fiber filler had sufficient properties as a heat dissipation sheet because of its large fiber diameter. Further, when observing the shape of the end face of the filler with a transmission electron microscope, the pitch-based carbon fiber filler has a structure in which a graphene sheet is closed. The phrase "graphene sheet is closed" refers to the state that an end portion of the graphene sheet itself constituting the carbon fiber is not exposed at an end portion of the carbon fiber, but a graphite layer is curved substantially in a U shape, and a curved portion is exposed at the end portion of the carbon fiber.

Patent Literature 2 discloses a thermally conductive sheet filled with carbon fibers and an inorganic filler. It is described that the average fiber length of the carbon fibers is 50 to 250 µm, the average particle size of the inorganic filler is 1 to 10 µm, the average thickness of the thermally conductive sheet is 500 µm or less, and even when the thickness is thin, excellent high thermal conductivity and excellent flexibility may be achieved at the same time.

However, the average short axis diameter of the carbon fibers constituting this thermally conductive sheet is as thick as 6 to 15 µm. When the inorganic filler is alumina, the average particle diameter is slightly small as 1 to 10 µm. Therefore, the alumina is dispersed in the carbon fiber, thus thermal resistance is large, and it cannot be said that thermal conductivity in a thickness direction is sufficient. Also, since the fiber diameter is large, it cannot be said that flexibility is sufficiently excellent. Here, the carbon fibers are oriented in a thickness direction of the thermally conductive sheet (vertically aligned to a sheet surface) (paragraph 0052), and thermal conductivity in a sheet extrusion direction (hereinafter referred to as in-plane direction) is not considered at all. That is, since the fiber diameter is large (6 to 15 µm) and the fiber length is long (50 to 250 µm), the number of carbon fibers (contained amount) contained in the sheet is small, and no thermal conduction path is formed, with respect to the thermal conductivity in the sheet extrusion direction (one direction in the plane).

CITATION LIST

Patent Literature

Patent Literature 1: JP 2009-132810 A
Patent Literature 2: JP 2015-029071 A

SUMMARY OF INVENTION

Technical Problem

A first object of the present invention is to provide a heat dissipation sheet having high heat dissipation properties as compared with a conventional heat dissipation sheet.

A second object of the present invention is to provide a heat dissipation sheet which has appropriate flexibility and has thermal conductivity not only in a direction parallel to a surface of the heat dissipation sheet (hereinafter also referred to as "in-plane direction") but also in a thickness direction.

Solution to Problem

The present inventors have extensively conducted studies in view of the above conventional techniques and resultantly found that by controlling the fiber diameter and fiber length of fibrous carbon, and orientation in a sheet, a heat dissipation sheet having high thermal conductivity is obtained.

Furthermore, the present inventors have found that by blending a predetermined filler, a heat dissipation sheet having excellent heat conductivity not only in an in-plane direction but also in a thickness direction is obtained.

These findings have led to completion of the present invention.

The present invention for solving the above problems is described below.

[1] A heat dissipation sheet containing fibrous carbon and a polymer, in which
the fibrous carbon has an average effective fiber length of 5 to 120 µm, an average fiber diameter of 200 to 900 nm, and an average aspect ratio of 30 to 10000, and
the content rate of the fibrous carbon is 5 to 85% by mass with respect to the total amount of the fibrous carbon and the polymer.

[2] The heat dissipation sheet according to [1], in which the degree of orientation A of the fibrous carbon determined by an X-ray diffraction method in one direction which is a direction parallel to a surface of the heat dissipation sheet and shows a highest degree of orientation is 55 to 95%.

[3] The heat dissipation sheet according to [1] or [2], in which thermal conductivity P in one direction which is a direction parallel to a surface of the heat dissipation sheet and shows a highest degree of orientation is 2 to 200 times thermal conductivity T in a thickness direction of the heat dissipation sheet.

The inventions described in [1] to [3] are heat dissipation sheets containing a predetermined amount of ultrafine fibrous carbon having a predetermined effective fiber length. This fibrous carbon has a degree of orientation of fibrous carbon preferably in a predetermined range in an in-plane direction of the heat dissipation sheet. Further, the thermal conductivity in the in-plane direction and the thermal conductivity in the thickness direction of the heat dissipation sheet are preferably in predetermined ranges.

[4] The heat dissipation sheet according to [1], further containing filler particles with an average particle diameter of 1 to 150 times the average fiber diameter of the fibrous carbon in an amount of 5 to 45% by mass with respect to the heat dissipation sheet.

[5] The heat dissipation sheet according to [4], in which the filler particles are at least one inorganic substance selected from the group consisting of mesocarbon microbeads (MCMB), boron nitride (BN), silicon carbide (SiC), aluminum nitride (AlN), silicon oxide, silicon, metal particles, titania, silica, and alumina.

[6] The heat dissipation sheet according to [4] or [5], in which thermal conductivity p in one direction which is a direction parallel to a surface of the heat dissipation sheet and shows a highest degree of orientation is 1.5 to 50 times thermal conductivity t in a thickness direction of the heat dissipation sheet.

The invention described in [4] is a heat dissipation sheet further containing filler particles of a predetermined size. It is preferable that the filler particles are the predetermined substances described in [5]. In the heat dissipation sheet according to [4] or [5], that the thermal conductivity in the in-plane direction and the thermal conductivity in the thickness direction of the heat dissipation sheet are preferably in predetermined ranges.

[7] The heat dissipation sheet according to [1], in which the thermal conductivity in the thickness direction of the sheet is 1.0 to 100 times the maximum value of the thermal conductivity in the in-plane direction of the sheet.

[8] The heat dissipation sheet according to [7], containing a carbon fiber molded body containing carbon fibers aligned in the thickness direction of the sheet.

The inventions described in [7] and [8] are heat dissipation sheets containing a carbon fiber molded body containing carbon fibers aligned in the thickness direction of the sheet. This carbon fiber molded body contains carbon fibers aligned in a predetermined direction and is a material which markedly improves thermal conductivity in an axial direction of the carbon fibers.

[9] The heat dissipation sheet according to any of [1] to [8], further containing carbon nanotubes with an average fiber length of 2 to 120 μm and an average fiber diameter of 0.4 to 50 nm in an amount of 1 to 60% by mass with respect to the heat dissipation sheet.

The invention described in [9] is a heat dissipation sheet containing a predetermined amount of carbon nanotubes of a predetermined size. Since this carbon nanotube aggregates in the heat dissipation sheet due to its characteristics, it improves the thermal conductivity in the thickness direction of the heat dissipation sheet.

[10] The heat dissipation sheet according to any of [1] to [8], in which the fibrous carbon is a pitch-based carbon fiber.

[11] The heat dissipation sheet according to any of [1] to [9], in which the fibrous carbon is fibrous carbon with a thickness (Lc) of a net plane group of 1 to 200 nm and a crystallite length (La) of 20 to 500 nm, as measured by an X-ray diffraction method.

The inventions described in [10] and [11] are a heat dissipation sheet in which the fibrous carbon is limited to a predetermined substance.

[12] The heat dissipation sheet according to any of [1] to [10], in which the thickness is in the range of 0.01 to 1 mm.

The invention described in [12] is a heat dissipation sheet whose thickness is limited to a predetermined range.

[13] The heat dissipation sheet according to any one of [1] to [11], in which the polymer is polyamide.

Advantageous Effects of Invention

According to the present invention, a heat dissipation sheet having high thermal conductivity as compared with a heat dissipation sheet known in the prior art is provided. Also, a heat dissipation sheet having particularly excellent thermal conductivity in one specific direction of the heat dissipation sheet is provided. Further, a heat dissipation sheet having excellent thermal conductivity not only in an in-plane direction of the heat dissipation sheet but also in a thickness direction is provided.

Such a heat dissipation sheet is formed extremely thin and has high thermal conductivity as compared with conventional products. Therefore, it is promising for applications that have a large calorific value and limited space (e.g., smartphone, heater, copier roller, LED, automobile, CPU).

BRIEF DESCRIPTION OF DRAWINGS

FIG. 1 is an electron micrograph (2000 times) of an ultrafine fibrous carbon of Manufacturing Example 1.

FIG. 2 is a reference diagram in which the electron micrograph in FIG. 1 is output in a white and black binary.

FIG. 3 is an electron micrograph of a surface of a heat dissipation sheet of Example 7.

FIG. 4 is an electron micrograph of a surface of a heat dissipation sheet of Comparative Example 13.

DESCRIPTION OF EMBODIMENTS

Hereinafter, the present invention will be described.
1. Fibrous Carbon
1-1. Properties of Fibrous Carbon Fibrous carbon in the present invention has a fibrous form substantially composed of only carbon, and representative examples thereof include carbon fiber. Here, the fibrous carbon may be, for example, one in which graphite, graphene, carbon nanotube, carbon nanohorn, fullerene, carbon black or activated carbon is bonded and connected by fusion, adhesion or the like to be a fibrous form. Specifically, this fibrous carbon may be in a fibrous form as a whole, and examples also include fibrous carbons in which those having an aspect ratio less than the preferable range described below come into contact with each other or are combined with each other to integrally form a fiber shape (for example, those in which spherical carbon is connected in a beaded form, those in which at least one or a plurality of extremely short fibers are combined by fusion or the like, and the like).

The fibrous carbon in the present invention has a high effect of forming a thermally conductive network in the heat dissipation sheet, and is preferably a carbon fiber from the viewpoint of improving heat dissipation characteristics. Examples of the carbon fiber also include vapor-grown carbon materials such as carbon nanotubes and carbon nanoribbons. A pitch-based carbon fiber is preferable to a PAN-based carbon fiber because the carbon fiber requires high crystallinity.

The fibrous carbon is not particularly limited, but is preferably has a linear structure with substantially no branching. Branching refers that the main axis of fibrous carbon is branched midway, and that the main axis of fibrous carbon has a branched secondary axis. The linear structure with substantially no branching means that the degree of branching of the fibrous carbon is 0.01 pieces/μm or less.

The fibrous carbon has an average fiber diameter in the range of 200 to 900 nm. The upper limit value is preferably 600 nm, more preferably 500 nm, and further preferably 400 nm. The lower limit value is preferably 210 nm, and more preferably 220 nm.

When the average fiber diameter of the fibrous carbon is in the range of 200 to 900 nm, the fibrous carbon is easy to regularly arrange mainly in one direction in a plane of the heat dissipation sheet, and the fibrous carbons appropriately come into contact with each other. Therefore, a heat dissipation path in one specific direction is efficiently formed. When the average fiber diameter is less than 200 nm, it is difficult for the fibrous carbon to form a linear structure. In addition, since the bulk density is very small, handling characteristics are poor, and it is difficult to disperse the fibrous carbon. Further, when the heat dissipation sheet is formed, the fibrous carbons excessively come into contact with each other and the thermal conduction resistance increases, so that thermal conductivity tends to decrease. When the average fiber diameter exceeds 900 nm, gaps between fibrous carbons are easily generated in the heat dissipation sheet, so that it may be difficult to form a sufficient thermal conduction path. In addition, irregularities are likely to be formed on the surface of the obtained thermally conductive sheet, so that the contact area with a heating element tends to decrease and the heat dissipation efficiency tends to decrease.

Here, the fiber diameter and effective fiber length in the present invention mean values measured from a photographic picture taken at a magnification of 2,000 times by a field emission type scanning electron microscope.

The effective fiber length of the fibrous carbon and the average effective fiber length thereof are preferably in the range of 5 to 120 μm, more preferably 5 to 100 μm, further preferably 8 to 70 μm, and most preferably 10 to 50 μm. When it is less than 5 μm, the thermal conductivity in the heat dissipation sheet is lowered, which is not preferable. When it exceeds 120 μm, dispersibility of fibrous carbon is impaired, which is not preferable. That is, when the fibrous carbon is too long, the fibrous carbon is excessively easily oriented in an in-plane direction of the heat dissipation sheet, and handling and molding tend to be difficult.

In the present invention, the effective fiber length is defined by an effective length, not an actual fiber length. This is because the fibrous carbon does not necessarily contribute to thermal conduction at the actual fiber length in the heat dissipation sheet. For example, the fiber is bent or rounded in the heat dissipation sheet, and therefore there are cases where the fibrous carbon does not contribute to heat conduction at the actual fiber length. In the present invention, the effective length of a fibrous carbon is defined as a length of the longest line segment, the both ends of which are in contact with single fibrous carbon. In other words, it is the maximum linear distance at which single fibrous carbon is made electrically conductive. That is, when the fibrous carbon has a completely linear structure, the effective length is substantially equal to the fiber length. When the fibrous carbon has a branched structure or is rounded, it refers to a length of the largest line segment connecting two points on the single fibrous carbon.

The ratio (aspect ratio, L/D) of the average effective fiber length (L) to the average fiber diameter (D) of the fibrous carbon is 30 or more, and preferably 40 or more. By setting the ratio (L/D) to 30 or more, a heat dissipation path is efficiently formed in the heat dissipation sheet, and a heat dissipation sheet having high thermal conductivity is obtained. When it is less than 30, formation of a heat dissipation path in the heat dissipation sheet tends to be insufficient, and the thermal conductivity in the in-plane direction in the heat dissipation sheet is lowered. The upper limit value of the aspect ratio (L/D) is not particularly limited, and it is generally 10000 or less, preferably 5000 or less, more preferably 1000 or less, further preferably 500 or less, further preferably 200 or less, further preferably 100 or less, and particularly preferably 80 or less. When it exceeds 10000, dispersibility of the fibrous carbon is impaired, which is not preferable.

It is preferable that the fibrous carbon has high crystallinity. The crystallite length (La) measured by an X-ray diffraction method which is an index of crystallinity is preferably 20 to 500 nm, more preferably 30 nm or more, further preferably 50 nm or more, further preferably 80 nm or more, further preferably 100 nm or more, further preferably 120 nm or more, and particularly preferably 140 nm or more. When it is less than 20 nm, crystallinity of the fibrous carbon is low and thermal conductivity is not sufficient. Meanwhile, while the crystallite size is measured by the X-ray diffraction method, a measurement error becomes large as the crystal grows greatly, and therefore practically the limit of measurement is 500 nm.

In the present invention, the crystallite length (La) measured by the X-ray diffraction method refers to a value measured in accordance with Japanese Industrial Standard JIS R 7651 (2007 edition) "Measurement of lattice parameters and crystallite sizes of carbon materials".

The fibrous carbon has a crystal plane spacing (d 002) of preferably 0.335 to 0.340 nm, and more preferably 0.335 to 0.339 nm, as measured by the X-ray diffraction method. By being in the range of 0.335 to 0.340 nm, the fibrous carbon has high graphite crystallinity, and excellent heat dissipation properties and oxidation resistance.

The fibrous carbon preferably has a thickness (Lc) of a net plane group of graphene (net plane group) of 1.0 to 200 nm. When it is less than 1.0 nm, the thermal conductivity of the fibrous carbon is markedly lowered, which is not preferable. Lc is more preferably 5 to 130 nm, and further preferably 10 to 130 nm.

As described above, the fibrous carbon used for the heat dissipation sheet of the present invention preferably has high crystallinity. The fibrous carbon having high crystallinity impart electroconductivity to the heat dissipation sheet. The fibrous carbon used for the heat dissipation sheet of the present invention preferably has high electroconductivity even in a state in which the packing density of fibrous carbon is low. The fibrous carbon having high electroconductivity in a state of low packing density impart thermal conductivity and electroconductivity to the heat dissipation sheet at a low added concentration. Specifically, the powder volume resistivity of the fibrous carbon when packed at a packing density of 0.4 g/cm$^3$ is preferably 1Ω·cm or less, and more preferably 0.5Ω·cm or less. When it exceeds 1Ω·cm, the addition amount of the fibrous carbon required for improving thermal conductivity and electroconductivity increases, which is not preferable. The lower limit value is not particularly limited, and it is about 0.0001Ω·cm.

1-2. Method for Manufacturing Fibrous Carbon

A method for manufacturing a pitch-based carbon fiber which is a preferred form as the fibrous carbon of the present invention will be described below. The method for manufacturing a pitch-based carbon fiber of the present invention may be manufactured by passing through, for example, the steps (1) to (4) described below.

(1) a fiber formation step for obtaining a resin composite fiber by molding a resin composition in a molten state to form a mesophase pitch into a fiber, the resin composition containing a thermoplastic resin, and 1 to 150 parts by mass of the mesophase pitch based on 100 parts by mass of the thermoplastic resin, the fiber formation step including an orientation control operation for improving the molecular orientation property of the mesophase pitch as necessary;

(2) a stabilization step for stabilizing the resin composite fiber to obtain a resin composite stabilized fiber;

(3) a thermoplastic resin removing step for removing the thermoplastic resin from the resin composite stabilized fiber to obtain a stabilized fiber; and (4) a carbonization and firing step for obtaining an ultrafine carbon fiber by heating the stabilized fiber under an inert atmosphere to carbonize or graphitize the stabilized fiber.

<Thermoplastic Resin>

The thermoplastic resin to be used in the method for manufacturing a pitch-based carbon fiber of the present invention is capable of manufacturing a resin composite fiber, and should be easily removed in the thermoplastic resin removing step. Examples of the thermoplastic resin include polyolefins, polyacrylate-based polymers such as polymethacrylate and polymethyl methacrylate, polystyrene, polycarbonate, polyarylate, polyester, polyamide, polyester carbonate, polysulfone, polyimide, polyetherimide, polyketone, and polylactic acid. Among them, polyolefins are preferably used.

Specific examples of the polyolefin include polyethylene, polypropylene, poly-4-methylpentene-1, and copolymers containing these polymers. From the viewpoint of easy removal in the thermoplastic resin removing step, polyethylene is preferably used. Examples of the polyethylene include homopolymers such as high-pressure low-density polyethylene, low-density polyethylene such as gas-phase/solution/high-pressure linear low-density polyethylene, medium-density polyethylene and high-density polyethylene; and copolymers of ethylene and other vinyl-based monomer such as copolymers of ethylene and an α-olefin and ethylene-vinyl acetate copolymers.

The thermoplastic resin for use in the present invention preferably has a melt mass flow rate (MFR) of preferably 0.1 to 10 g/10 min, more preferably 0.1 to 5 g/10 min, and particularly preferably 0.1 to 3 g/10 min, as measured in accordance with JIS K 7210 (1999). When the MFR is in the above-mentioned range, the mesophase pitch may be favorably micro-dispersed in the thermoplastic resin. In addition, in molding of the resin composite fiber, the fiber is stretched, so that the fiber diameter of the resulting carbon fiber is further reduced. The thermoplastic resin for use in the present invention has a glass transition temperature of preferably 250° C. or less when being amorphous, and a melting point of preferably 300° C. or less when being crystalline, in that the thermoplastic resin may be easily melt-kneaded with the mesophase pitch.

<Mesophase Pitch>

The mesophase pitch is a pitch capable of forming an optically anisotropic phase (liquid crystal phase) in a molten state. Examples of the mesophase pitch for use in the present invention include those obtained using a distillation residue of coal or petroleum as a raw material, and those obtained using an aromatic hydrocarbon such as naphthalene as a raw material. For example, a mesophase pitch derived from coal is obtained by a treatment mainly including hydrogenation/heat treatment of coal tar pitch; a treatment mainly including hydrogenation/heat treatment/solvent extraction; or the like.

More specifically, it is obtained by the following method.

First, a coal tar pitch freed of a quinoline-insoluble component and with a softening point of 80° C. is hydrogenated at a pressure of 13 MPa and a temperature of 340° C. in the presence of a Ni-Mo based catalyst to obtain a hydrogenated coal tar pitch. The hydrogenated coal tar pitch is heat-treated at 480° C. under atmospheric pressure and then decompressed to remove a low-boiling-point component to obtain a crude mesophase pitch. The crude mesophase pitch is filtered at a temperature of 340° C. using a filter to remove foreign matters, whereby a purified mesophase pitch is obtained.

The optical anisotropy content (mesophase ratio) of the mesophase pitch is preferably 80% or more, and more preferably 90% or more.

In addition, the mesophase pitch has a softening point of preferably 100 to 400° C., and more preferably 150 to 350° C.

<Resin Composition>

Preferably, a resin composition (hereinafter, also referred to as a mesophase pitch composition) containing a thermoplastic resin and a mesophase pitch, which is used in the method for manufacturing a pitch-based carbon fiber of the present invention, contains a thermoplastic resin, and 1 to 150 parts by mass of a mesophase pitch based on 100 parts by mass of the thermoplastic resin. The content of the mesophase pitch is more preferably 5 to 100 parts by mass. When the content of the mesophase pitch exceeds 150 parts by mass, a resin composite fiber with a desired fiber diameter cannot be obtained, and when it is less than 1 part by mass, a problem such that an intended carbon fiber cannot be manufactured at a low cost is generated, which are not preferable.

For manufacturing a carbon fiber with a fiber diameter of 900 nm or less, the dispersion diameter of the mesophase pitch in the thermoplastic resin is preferably 0.01 to 50 μm, and more preferably 0.01 to 30 μm. When the dispersion diameter of the mesophase pitch in the thermoplastic resin deviates from the range of 0.01 to 50 μm, it may be difficult to manufacture a desired carbon fiber. In the mesophase pitch composition, the mesophase pitch forms a spherical or elliptical island phase. The dispersion diameter in the present invention means a diameter thereof when the island phase has a spherical shape, and means a major axis thereof when the island phase has an elliptical shape.

The dispersion diameter of 0.01 to 50 μm is kept in the above-mentioned range preferably even after the mesophase pitch composition is held at 300° C. for 3 minutes, more preferably even after held at 300° C. for 5 minutes, and particularly even after held at 300° C. for 10 minutes. In general, when a mesophase pitch composition is held in a molten state, the mesophase pitch is aggregated in the resin composition with time. When the mesophase pitch is aggregated and the dispersion diameter thereof exceeds 50 μm, it may be difficult to manufacture a desired carbon fiber. The aggregation rate of the mesophase pitch in the resin composition varies depending on the types of a thermoplastic resin to be used and the mesophase pitch.

The mesophase pitch composition is manufactured by kneading the thermoplastic resin and the mesophase pitch in a molten state. Melt-kneading of the thermoplastic resin and the mesophase pitch is carried out using a known apparatus. For example, one or more selected from the group consisting of a single-screw kneader, a twin-screw kneader, a mixing roll, and a Banbury mixer may be used. Among them, for the purpose of favorably micro-dispersing the mesophase pitch in the thermoplastic resin, it is preferable to use a twin-screw kneader, and it is particularly preferable to use a twin-screw kneader in which each shaft is rotated in the same direction.

The kneading temperature is not particularly limited as long as the thermoplastic resin and the mesophase pitch are in a molten state, and it is preferably 100 to 400° C., and more preferably 150 to 350° C. When the kneading temperature is lower than 100° C., the mesophase pitch does not become molten state, and it is difficult to micro-disperse the mesophase pitch in the thermoplastic resin. On the other hand, when it exceeds 400° C., decomposition of the thermoplastic resin or mesophase pitch may progress. In addition, the melt-kneading time is preferably 0.5 to 20 minutes, and more preferably 1 to 15 minutes. When the melt-kneading time is less than 0.5 minutes, it is difficult to micro-disperse the mesophase pitch into the thermoplastic resin. On the other hand, when it exceeds 20 minutes, the productivity of the carbon fiber is markedly lowered.

Melt-kneading is carried out preferably under an inert atmosphere having an oxygen gas content of less than 10% by volume, more preferably under an inert atmosphere having an oxygen gas content of less than 5% by volume, and particularly under an inert atmosphere having an oxygen gas content of less than 1% by volume. The mesophase pitch for use in the present invention may be denatured by reacting with oxygen during melt-kneading to hinder micro-dispersion into the thermoplastic resin. Therefore, it is preferable to perform melt-kneading under an inert atmosphere for suppressing a reaction between oxygen and the mesophase pitch.

<Resin Composite Fiber>

The method for manufacturing a resin composite fiber from the mesophase pitch composition is not limited as long as a desired carbon fiber can be prepared, and examples thereof may include a method in which a mesophase pitch composition is melt-spun using a spinning nozzle, and a method in which a mesophase pitch is melt and formed into a film using a rectangular nozzle.

For obtaining the carbon fiber of the present invention, it is preferable to perform an orientation control operation for improving the molecular orientation property of the mesophase pitch contained in the resin composite fiber in a stage of obtaining the resin composite fiber. In the orientation control operation, it is necessary to deform the mesophase pitch in a molten state for improving the molecular orientation property of the mesophase pitch in a molten state. Examples of the orientation control operation may include a method of applying strain due to shearing and a method of applying strain by extension to the mesophase pitch in a molten state. These methods may be carried out either alone or in combination. In particular, the method of applying strain by extension is preferable because it has a great effect of improving the molecular orientation property.

Examples of the method of applying strain by shearing include a method in which the linear velocity of the mesophase pitch composition in a molten state is increased. Specifically, by increasing the passage speed of the mesophase pitch composition in a molten state in a channel of a spinning nozzle or rectangular nozzle, strain by shearing may be applied.

Examples of the method of applying strain by extension include a method in which the linear velocity of the mesophase pitch composition in a molten state is gradually increased as going toward the discharge side of a spinning nozzle or rectangular nozzle. Specific examples thereof include a method in which the cross-sectional area of a channel of a nozzle is gradually reduced as going toward the discharge side (deformation inside the nozzle), and a method in which the mesophase pitch composition discharged from a discharge hole of a spinning nozzle or rectangular nozzle is taken up at a linear velocity higher than the discharge linear velocity (deformation outside the nozzle). In the case of deformation inside the nozzle, the mesophase pitch with the molecular orientation property improved by deformation tends to have poor molecular orientation property as a result of thermal relaxation. On the other hand, in the case of deformation outside the nozzle, the mesophase pitch with the molecular orientation property improved by deformation is immediately cooled to reduce flowability thereof, so that the molecular orientation property of the mesophase pitch is retained. Therefore, as an orientation control operation, the method of applying strain by extension at the outside the nozzle is preferable.

In these methods, it is important to control shear strain rate and extension strain rate.

Each of the shear strain rate and the extension strain rate is 5 to 10000 $s^{-1}$, and preferably 100 to 1400 $s^{-1}$. When it is less than 5 $s^{-1}$, the molecular orientation property of the mesophase pitch cannot be sufficiently improved. When it exceeds 10000 $s^{-1}$, deformation of the mesophase pitch cannot follow, and thus it is unable to deform it into a fibrous form.

By the control as described above, the molecular orientation property of the mesophase pitch may be improved, and a carbon fiber having a small coefficient of variation of the fiber diameter may be obtained.

The temperature in the operation for improving the molecular orientation property of the mesophase pitch is required to be higher than the melting temperature of the mesophase pitch, and is preferably 150 to 400° C., and more preferably 180 to 350° C. When it exceeds 400° C., the deformation relaxation rate of the mesophase pitch increases, so that it is difficult to maintain the shape of a fiber.

The draft ratio, which is a ratio of the discharge linear velocity and the take-up rate, is preferably 2 to 100, and more preferably 2 to 50. When it is more than 100, deformation of the mesophase pitch cannot follow, and thus the mesophase pitch cannot be deformed into a fibrous form, which is not preferable. When it is less than 2, the molecular orientation property of the mesophase pitch cannot be improved, and as a result, crystallinity of the resulting fibrous carbon is reduced.

In addition, the fiber formation step of a resin composite fiber may include a cooling step. As a cooling step, for example, in the case of melt spinning, there is a method in which the atmosphere downstream of the spinning nozzle is cooled. In the case of melt film formation, there is a method in which a cooling drum is provided downstream of the rectangular nozzle. By providing the cooling step, a region where the mesophase pitch is deformed by extension may be adjusted, and the rate of strain may be adjusted. In addition, by providing the cooling step, the resin composite fiber after spinning or film formation is immediately cooled and solidified to enable stable molding.

<Resin Composite Stabilized Fiber>

From the resin composite fiber obtained as described above, a resin composite stabilized fiber is prepared by stabilizing (also referred to as "infusibilizing") a mesophase pitch fiber contained in the resin composite fiber. The stabilization is carried out by a known method such as a gas flow treatment using air, oxygen, ozone, nitrogen dioxide, a halogen or the like, and a solution treatment using an acidic aqueous solution or the like. Infusibilization by a gas flow treatment is preferable in terms of productivity.

As a gas component to be used, air, oxygen, or a mixed gas containing air and oxygen is preferable in terms of ease of handling, and use of air is particularly preferable in terms of cost. The concentration of an oxygen gas to be used is preferably in the range of 10 to 100% by volume of the total gas composition. When the oxygen gas concentration is less than 10% by volume of the total gas composition, a large amount of time is required to stabilize the mesophase pitch contained in the resin composite fiber.

The reaction temperature for stabilization is preferably 50 to 350° C., more preferably 60 to 300° C., further preferably 100 to 300° C., and particularly preferably 200 to 300° C. The treatment time for stabilization is preferably 10 to 1200 minutes, more preferably 10 to 600 minutes, further preferably 30 to 300 minutes, and particularly preferably 60 to 210 minutes.

The softening point of the mesophase pitch is markedly increased by the stabilization treatment. For the purpose of obtaining a desired carbon fiber, the softening point of the mesophase pitch is preferably 400° C. or more, and further preferably 500° C. or more.

<Thermoplastic Resin Removing Step>

Next, the thermoplastic resin contained in the resin composite stabilized fiber obtained as described above is removed to separate the stabilized fiber. In this stop, the thermoplastic resin is decomposed and removed while thermal decomposition of the stabilized fiber is suppressed. Examples of a method for decomposing and removing the thermoplastic resin include a method of removing the thermoplastic resin using a solvent and a method of removing the thermoplastic resin by thermal decomposition.

Thermal decomposition of the thermoplastic resin is preferably carried out under an inert gas atmosphere. The inert gas atmosphere herein refers to a gas atmosphere of carbon dioxide, nitrogen, argon or the like. The oxygen concentration thereof is preferably 30 ppm by volume or less, and more preferably 20 ppm by volume or less. As the inert gas to be used in this step, carbon dioxide and nitrogen are preferably used in terms of cost, and nitrogen is particularly preferably used.

Thermal decomposition of the thermoplastic resin may also be carried out under a reduced pressure. By carrying out thermal decomposition under a reduced pressure, the thermoplastic resin may be sufficiently removed. As a result, a carbon fiber or a graphitized fiber obtained by carbonizing or graphitizing the stabilized fiber may reduce fusion between fibers. The atmospheric pressure is preferably as low as possible, and is preferably 50 kPa or less, more preferably 30 kPa or less, further preferably 10 kPa or less, and particularly preferably 5 kPa or less. On the other hand, since it is difficult to achieve perfect vacuum, the lower limit of the pressure is generally 0.01 kPa or more.

When thermal decomposition of the thermoplastic resin is carried out under a reduced pressure, a very small amount of oxygen and an inert gas may be present as long as the atmosphere pressure is maintained. Particularly, it is preferable that a very small amount of an inert gas is present because fusion between fibers due to thermal deterioration of the thermoplastic resin is suppressed. The very small amount of oxygen herein refers that the oxygen concentration is 30 ppm by volume or less, and the very small amount of an inert gas herein refers that the inert gas concentration is 20 ppm by volume or less. The type of inert gas to be used is as described above.

The thermal decomposition temperature is preferably 350 to 600° C., and more preferably 380 to 550° C. When the thermal decomposition temperature is less than 350° C., thermal decomposition of the stabilized fiber may be suppressed, but thermal decomposition of the thermoplastic resin cannot be sufficiently performed in some cases. On the other hand, when it exceeds 600° C., thermal decomposition of the thermoplastic resin is sufficiently performed, but the stabilized fiber is thermally decomposed in some cases, and as a result, the yield tends to decrease. The thermal decomposition time is preferably 0.1 to 10 hours, and more preferably 0.5 to 10 hours.

In the manufacturing method of the present invention, it is preferable that the stabilization step and the thermoplastic resin removing step are carried out with the resin composite fiber or resin composite stabilized fiber held on a support base material in a basis weight of 2 kg/m$^2$ or less. By holding on the support base material, it is possible to suppress aggregation of the resin composite fiber or the resin composite stabilized fiber caused by heat treatment at the time of the stabilization treatment or removal of the thermoplastic resin, and to maintain air permeability.

As a material of the support base material, it is necessary that deformation and corrosion are not caused by a solvent or heating. In addition, the heat-resistant temperature of the support base material is preferably 600° C. or more since it is necessary not to be deformed at a thermal decomposition temperature in the thermoplastic resin removing step. Examples of the material may include metallic materials such as stainless steel, and ceramic materials such as alumina and silica.

The shape of the support base material is preferably a shape having air permeability in a direction perpendicular to the surface. A mesh structure is preferable as such a shape. The aperture of the mesh is preferably 0.1 to 5 mm. When the aperture is more than 5 mm, fibers may be easily aggregated on a mesh line by heating treatment, leading to insufficient stabilization of the mesophase pitch and removal of the thermoplastic resin. On the other hand, when the aperture of the mesh is less than 0.1 mm, the permeability of the support base material may be reduced due to a decrease in porosity of the support base material.

<Carbonization and Firing Step>

By carbonizing and/or graphitizing the stabilized fiber under an inert atmosphere, the carbon fiber of the present invention is obtained. As a container to be used here, a crucible-like container made of graphite is preferable. Here, carbonization refers to heating at a relatively low temperature (preferably about 1000° C.), and graphitization refers to growing graphite crystals by heating at a higher temperature (about 3000° C.)

Examples of the inert gas to be used for carbonization and/or graphitization of the stabilized fiber include nitrogen, argon and the like. The concentration of oxygen in the inert atmosphere is preferably 20 ppm by volume or less, and more preferably 10 ppm by volume or less. The heating temperature during carbonization and/or graphitization is preferably 500 to 3500° C., and more preferably 800 to 3200° C. The firing time is preferably 0.1 to 24 hours, and more preferably 0.2 to 10 hours.

In the present invention, the temperature for carbonization and/or graphitization may be carried out at a relatively low temperature. By carbonizing and/or graphitizing at 1000 to 2400° C., for example, the proportion of carbon fibers with a long effective fiber length may be increased. The lower limit value of the heating temperature is preferably 1000° C., more preferably 1200° C., further preferably 1300° C., still more preferably 1400° C. or more, and particularly preferably 1500° C. or more. In addition, when it is 2400° C. or more, crystallization proceeds too much and the carbon fiber may be easily broken.

<Grinding Treatment>

The method for manufacturing a carbon fiber of the present invention may include a grinding treatment step. The grinding treatment is preferably carried out after the thermoplastic resin removing step and/or after the carbonizing and firing step. As the grinding method, it is preferable to apply a fine grinder such as a jet mill, a ball mill, a bead mill, an impeller mill or a cutter mill, and after grinding, classification may be carried out as necessary. In the case of wet grinding, a dispersion medium is removed after grinding, but when marked secondary aggregation occurs at this time, subsequent handling is very difficult. In this case, it is preferable to carry out a crushing operation using a ball mill, a jet mill or the like after drying.

2. Polymer

The polymer in the present invention may be either a thermoplastic polymer or a thermosetting polymer. Any polymer may be used as long as it may uniformly disperse the fibrous carbon in the polymer. A polymer may be referred to herein as a binder.

Examples of the thermoplastic polymer include various polymers such as fluorine-based, polyamide-based, acrylic-based, polyurethane-based and vinyl-based polymers. Among them, polyvinylidene fluoride, polyimide, CONEX and the like are preferable in that they do not deform a heat dissipation sheet against thermal stress and external force which may occur between an electronic component and the heat dissipation sheet.

Examples of the thermosetting polymer include various types polymers such as silicon-based and epoxy-based polymers. Among them, silicone gel and silicone rubber are preferable in that they have flexibility and thus may prevent occurrence of voids between the electronic component and the heat dissipation sheet.

As the blending amount of the fibrous carbon and the polymer, the fibrous carbon is 5 to 85% by mass with respect to the total amount of the fibrous carbon and the polymer. The lower limit of the blending amount of the fibrous carbon is preferably 8% by mass, more preferably 10% by mass, and particularly preferably 15% by mass. The upper limit of the blending amount of the fibrous carbon is preferably 80% by mass, more preferably 70% by mass, and particularly preferably 60% by mass.

When the blending amount of the fibrous carbon is less than 5% by mass, thermal conductivity becomes insufficient depending on the use. Also, when it exceeds 85% by mass, it may be difficult to uniformly disperse the fibrous carbon in the binder, or moldability of the heat dissipation sheet may be affected.

3. Filler Particles

The heat dissipation sheet of the present invention may contain filler particles. By blending the filler particles, thermal conductivity in a thickness direction of the heat dissipation sheet may be improved. Examples of the shape of the filler particles may include spherical, elliptical, lumpy, and granular shapes. In the case of a shape other than a spherical shape, their average particle diameter is calculated assuming it to be a true sphere. That is, in the case of an elliptical shape, it means long diameter, and in the case of a lumpy or granular shape, it means longest length. Further, the filler particles may be solid or hollow.

The filler particles used in the present invention may be either inorganic substance or organic substance. As the inorganic substance, for example, mesocarbon microbeads (MCMB), boron nitride (BN), silicon carbide (SiC), aluminum nitride (AlN), silicon, silica, alumina, metal particles such as copper and silver, silicon oxide and titania are preferable, and these may be used alone or in combination of two or more kinds. Among them, mesocarbon microbeads (MCMB) are preferred.

The average particle diameter of the filler particles is preferably in the range of 1 to 150 times the average fiber diameter of the above-described fibrous carbon. The lower limit of the average particle diameter of the filler particles is preferably 1.5 times, more preferably 3 times, further preferably 5 times, further preferably 10 times, further preferably 30 times, and particularly preferably 50 times. The upper limit of the average particle diameter of the filler particles is preferably 120 times, and more preferably 100 times. When it is less than 1 time, aggregation of filler particles occurs to deteriorate dispersibility, and it is not possible to sufficiently increase the thermal conductivity in the thickness direction of the heat dissipation sheet. When it exceeds 150 times, the heat dissipation sheet has poor moldability and poor adhesion to a heating element, so that it is not possible to sufficiently increase the thermal conductivity.

When the filler particles are mesocarbon microbeads (MCMB), the average particle diameter thereof is preferably from 1 to 50 μm, more preferably from 5 to 30 μm, and particularly preferably from 5 to 25 μm. When the average particle diameter is less than 1 μm, aggregation of the particles occurs to deteriorate dispersibility, and it is not possible to sufficiently increase the thermal conductivity in the thickness direction of the heat dissipation sheet. When it exceeds 50 μm, the number of fillers contained in the heat dissipation sheet is small, making it difficult to form a thermal conduction path, and it is not possible to sufficiently increase the thermal conductivity in the thickness direction of the heat dissipation sheet.

The filler particles may be subjected to a surface treatment. Examples of the surface treatment may include a hydrophilization treatment or a surface treatment with a coupling agent. When subjected to the surface treatment, aggregation of filler particles is reduced, dispersibility in the heat dissipation sheet is improved, and the thermal conductivity can be improved in some cases.

The content of the filler particles is not particularly limited, and may be appropriately selected depending on the purpose. The filler particles are preferably blended in an amount of 5% by mass or more, more preferably 10% by mass or more, further preferably 15% by mass or more, and particularly preferably 20% by mass or more, on the basis of the mass of the entire heat dissipation sheet of the present invention. On the other hand, the blending amount of the filler particles is preferably 45% by mass or less, more preferably 40% by mass or less, and particularly preferably 35% by mass or less.

4. Other Substances

The heat dissipation sheet of the present invention contains the above fibrous carbon and polymer as essential components and the filler particles as an optional component. Besides this, optional components such as flame retardant materials, colorants and the like may be blended.

In the heat dissipation sheet of the present invention, for the purpose of further improving heat dissipation properties, an inorganic material or an organic material other than fibrous carbon, for example, carbon black such as graphite, boron nitride, silica, alumina, aluminum nitride and acetylene black may be contained in a proportion of 25% by mass or less with respect to the entire heat dissipation sheet.

Also, in the heat dissipation sheet of the present invention, in order to control the mechanical strength and electric characteristics in a plane or in a thickness direction, an inorganic material or an organic material other than fibrous carbon, for example, carbon black such as graphite, carbon nanotube, boron nitride, silica, alumina, aluminum nitride and acetylene black which are electroconductive and insulation fillers that are heterogeneous particles and the like may be contained in a proportion of 25% by mass or less with respect to the entire heat dissipation sheet.

In particular, carbon nanotubes described below may be also blended as a material complementing the thermal conductivity in the thickness direction of the heat dissipation sheet.

Examples of the carbon nanotubes (CNT) may include carbon nanotubes with an average fiber length of 2 to 120 μm and an average fiber diameter of 0.4 to 50 nm. Since such a CNT aggregates appropriately, it is difficult to be oriented in the in-plane direction of the heat dissipation sheet even though it is fibrous. Therefore, the thermal conductivity in the thickness direction of the heat dissipation sheet may be improved. The blending amount of CNT is preferably 1 to 60% by mass and more preferably 2 to 50% by mass with respect to the heat dissipation sheet.

5. Heat Dissipation Sheet 5-1. Properties of Heat Dissipation Sheet of First Aspect The heat dissipation sheet of the present invention of the first aspect is excellent in thermal conductivity, and particularly good thermal conductivity in one direction (X direction (usually MD direction)) in a plane. It is because the aspect ratio of the fibrous carbon is usually high although it depends on the manufacturing method, thus the fibrous carbon is basically oriented in the MD direction (X direction) in the plane of the heat dissipation sheet, and is usually oriented in a TD direction (Y direction) and a thickness direction (Z direction).

In the heat dissipation sheet of the present invention, the degree of orientation of the fibrous carbon is preferably in a predetermined range. Specifically, the degree of orientation A in one direction which is a direction parallel to a surface of the heat dissipation sheet and shows a highest degree of orientation is preferably 55 to 95%, more preferably 60 to 95%, further preferably 70 to 95%, and particularly preferably 75 to 95%. Within this range, the fibrous carbon is arranged in parallel mainly in one direction, and substantially all of the adjacent fibrous carbons in the front, rear, right and left are appropriately in contact with each other. Therefore, many thermal conduction paths are formed in the X direction, and the thermal conductivity is higher than that in the Y direction and the Z direction. The heat dissipation sheet of the present invention efficiently release the heat applied to the heat dissipation sheet in one specific direction (X direction) in the plane.

The degree of orientation B in a direction parallel to a surface of the heat dissipation sheet and in a direction perpendicular to the one direction which shows a highest degree of orientation as described above is preferably 5 to 45%, and more preferably 10 to 40%.

In the heat dissipation sheet of the present invention, thermal conductivity P in one direction which is a direction parallel to a surface of the heat dissipation sheet and shows a highest degree of orientation is preferably 2 to 200 times thermal conductivity T in a thickness direction of the heat dissipation sheet. The lower limit of P/T is preferably 5 times, more preferably 10 times, further preferably 20 times, further preferably 30 times, and particularly preferably 45 times. The upper limit of P/T is preferably 150 times, more preferably 90 times, and further preferably 80 times. The heat dissipation sheet having such orientation characteristics dissipate heat in a direction parallel to the sheet surface and in a predetermined direction.

Such a heat dissipation sheet is manufactured by blending the above-described fibrous carbon in the heat dissipation sheet. The sheeting may be carried out by a known method and known conditions. For example, when the sheeting method is a solution casting method, the value of P/T may be controlled by appropriately adjusting the viscosity of the solution and the solution casting speed.

5-2. Properties of Heat Dissipation Sheet of Second Aspect

The heat dissipation sheet of the present invention of the second aspect is excellent in thermal conductivity, and particularly not only good thermal conductivity in one direction (X direction (usually MD direction)) in a plane but also excellent in thermal conductivity in a thickness direction (Z direction) of the heat dissipation sheet. The maximum value of thermal conductivity p in the in-plane direction (X direction) of the heat dissipation sheet is preferably 1.5 to 100 times thermal conductivity t in the thickness direction. The upper limit of p/t is preferably 60 times, more preferably 50 times, further preferably 40 times, further preferably 35 times, and particularly preferably 30 times. The heat dissipation sheet having such orientation characteristics dissipate heat in a direction parallel to the sheet surface but also in a thickness direction. In addition, it is possible to transfer heat efficiently from a heat source to the heat dissipation sheet.

Such a heat dissipation sheet may be manufactured by incorporating filler particles with a particle diameter of 1 to 150 times the average fiber diameter of the fibrous carbon. In particular, as the particle diameter of the filler particles is increased and the content of the filler particles is increased, the thermal conductivity in the thickness direction may be increased. That is, the value of p/t may be appropriately adjusted depending on the average particle diameter of the filler particles and the blending amount.

In the present invention, the degree of orientation refers to the value measured by the method described in the examples.

The thickness of the heat dissipation sheets of the first and second aspects of the present invention is preferably 0.01 to 1 mm, and more preferably 0.1 to 1 mm. When the thickness deviates from the above range, it becomes difficult to observe the anisotropy of thermal conductivity in the X, Y and Z directions.

The maximum value of the thermal conductivity in the in-plane direction of the sheet is preferably 2 to 200 $W \cdot m^{-1} \cdot K^{-1}$, and more preferably 5 to 150 $W \cdot m^{-1} \cdot K^{-1}$.

Also, the thermal conductivity in the thickness direction of the sheet is preferably 3 to 150 $W \cdot m^{-1} \cdot K^{-1}$, and more preferably 5 to 100 $W \cdot m^{-1} \cdot K^{-1}$.

When the maximum thermal conductivity in one direction (for example, MD direction) in the in-plane direction is measured in a case where polyvinylidene fluoride is 90% by mass as a binder and the proportion of fibrous carbon is 10% by mass, the heat dissipation sheet of the present invention has a thermal conductivity of 11.33 $W \cdot m^{-1} \cdot K^{-1}$ or more. The thermal conductivity of 11.33 $W \cdot m^{-1} \cdot K^{-1}$ is about one order of magnitude higher than the thermal conductivity of polyvinylidene fluoride used as a matrix.

5-3. Manufacturing Method of Heat Dissipation Sheet

The heat dissipation sheet of the present invention can be manufactured by a conventionally known method for manufacturing a sheet, such as a melt molding method, a solution casting method or a dipping method. Hereinafter, a solution casting method using a pitch-based carbon fiber as the fibrous carbon and polyvinylidene fluoride as the binder will be described.

In this case, fibrous carbon and polyvinylidene fluoride are mixed in a solvent (for example, N-methyl-2-pyrrolidone) that dissolves polyvinylidene fluoride to dissolve the polyvinylidene fluoride and to disperse the fibrous carbon to prepare a slurry. Next, this slurry is flowed onto a base material such as a release film and molded into a predetermined thickness with a doctor blade or the like. Subsequently, the solvent is removed by decompression or heating, and a sheet is obtained by peeling it off from the base material.

In this case, fibrous carbon and polyvinylidene fluoride are mixed in a solvent (for example, N-methyl-2-pyrrolidone) that dissolves polyvinylidene fluoride to dissolve the polyvinylidene fluoride and to disperse the fibrous carbon to prepare a slurry. Also, filler particles, carbon nanotubes and the like are contained as necessary. Next, this slurry is flowed onto a base material such as a release film and molded into a predetermined thickness with a doctor blade or the like. Subsequently, the solvent is removed by decompression or heating, and a sheet is obtained by peeling it off from the base material. The slurry may be changed, for example, so as to obtain a desired degree of in-plane orientation of fibrous carbon depending on the solid content concentration and the solution casting speed, but by setting the solid content concentration within the range of 15 to 55% by mass, the fibrous carbon may be oriented at a high degree of orientation A (55 to 95%) in one direction in a plane. At this time, the solution casting speed is preferably in the range of 0.2 to 60 cm/min. In addition, as the average effective fiber length of the fibrous carbon increases, the number of contact points of the fibrous carbon increases and the number of overlapping increases, so that the degree of orientation A also tends to increase.

At this time, it is also preferable to orient the fibrous carbon in a predetermined direction by an electric field or a magnetic field.

5-4. Properties and Manufacturing Method of Heat Dissipation Sheet of Third Aspect The heat dissipation sheet of the third aspect of the present invention is particularly excellent in thermal conductivity in a thickness direction (Z direction) of the sheet. The thermal conductivity in the thickness direction (Z direction) of the heat dissipation sheet is preferably 1.0 to 100 times and more preferably 2.0 to 80 times the maximum value of the thermal conductivity in an in-plane direction of the sheet. The heat dissipation sheet having such characteristics efficiently dissipate heat in the sheet thickness direction.

Such a heat dissipation sheet may be manufactured by slicing a predetermined carbon fiber molded body.

Examples of the carbon fiber molded body may include a carbon fiber molded body containing carbon fibers aligned in a predetermined direction. That is, examples include a rod-like body of carbon fibers prepared by impregnating or coating carbon fibers aligned in a predetermined direction with a resin or the like. Alternatively, examples include a rod-like body in which fibrous carbon in a mixture of the fibrous carbon and the resin is oriented in one direction by extrusion molding the mixture. By slicing these rod-like bodies in a direction perpendicular to an axis of the rod-like bodies, the heat dissipation sheet of the third aspect is manufactured. In such a carbon fiber molded body, carbon fibers are fixed with a resin or the like. Therefore, the heat dissipation sheet obtained by slicing the same form a thermal conduction path in the thickness direction of the sheet, and the thermal conductivity in the thickness direction of the sheet may be improved.

EXAMPLES

Hereinafter, the present invention will be further specifically described by way of examples, but the present invention is not limited to these examples. Various measurements and analyses in examples were performed in accordance with the following methods, respectively.

(1) Confirmation of Shape of Fibrous Carbon Etc.

Observation and photographing were performed using a desk-top electron microscope (manufactured by JEOL Ltd., model: NeoScope JCM-6000). The average fiber diameter of fibrous carbon and the like was determined by measuring the fiber diameters at 300 spots randomly selected in the obtained electron micrograph, and calculating the average value of all the measurement results thereof (n=300). The average effective fiber length was calculated in the same manner.

(2) Measurement of Degree of Orientation

The degree of orientation of the fibrous carbon in the heat dissipation sheet is measured using X-ray diffractometer "RINT-TTR III" manufactured by RiGaku Corporation under the following measurement conditions.

X-ray source: Cu-Kα ($\lambda$=1.5418 Å), 50 kV-300 mA (15 kW),

Parallel beam method: using fiber sample stand,

Measurement: 2θ fixed at 26.3°, sample stand 360° rotation,

Analysis: Calculation is based on the half-value width of the azimuth distribution curve of graphite (002) diffraction peak obtained.

(3) X Ray Diffraction Measurement of Fibrous Carbon Etc.

In X-ray diffraction measurement, the lattice spacing (d 002) and the crystallite size (La, Lc) were measured in accordance with the JIS R 7651 method using RINT-2100 manufactured by Rigaku Corporation.

(4) Method for Measuring Powder Volume Resistivity

The powder volume resistivity was measured with a four-probe-type electrode unit under a load of 0.25 to 2.50 kN using a powder resistance system (MCP-PD51) manufactured by Dia Instruments Co., Ltd. The volume resistivity was defined as a volume resistivity value at a packing density of 0.4 $g/cm^3$ from a relationship of a volume resistivity with a change in packing density.

(5) Measurement of Thermal Conductivity

The thermal conductivity in the in-plane direction (MD direction) and film thickness direction of the heat dissipation sheet was measured by using LFA 447 manufactured by NETZSCH Japan K.K. according to the conditions of in-plane method. A measurement sample was prepared by punching out the formed heat dissipation sheet to a size of 1.8 φ. The thermal conductivity described below is a value in the direction showing the maximum in the in-plane direction (MD direction) of the heat dissipation sheet.

(6) Calculation of Shear Rate

While the shear rate inside a rectangular nozzle varies depending on a position in the nozzle and is not constant, it was calculated as an apparent shear rate from the following formula (1).

[Expression 1]

$$V=6Q/BH^2 \quad \text{Formula (1)}$$

v: shear rate
Q: outflow amount
B: slit length
H: slit width (7) Calculation of Extension Strain Rate While the extension strain rate inside the nozzle and the extension strain rate outside the nozzle are not constant, the extension strain rate was calculated from the following formula (2) assuming that deformation proceeds at a constant extension strain rate in the range from the start of deformation until the end of deformation.

[Expression 2]

$$\varepsilon=(v_T-v_O)(v_T+v_O)/2L_T V_O \quad \text{Formula (2)}$$

ε: extension strain rate
$L_T$: distance to end of deformation
$v_T$: rate after deformation determined by outflow amount and cross-sectional area
$v_O$: rate before deformation determined by outflow amount and cross-sectional area Manufacturing Example 1

Manufacturing of Fibrous Carbon 90 parts by mass of high-density polyethylene (manufactured by Prime Polymer Co., Ltd., HI-ZEX 5000 SR, melt viscosity: 14 Pa·s at 350° C. and 600 s⁻¹, MFR=0.37 g/10 min) as a thermoplastic resin and 10 parts by mass of Mesophase Pitch AR-MPH (manufactured by Mitsubishi Gas Chemical Company, Inc.) as a mesophase pitch were melt-kneaded in a co-rotating twin-screw extruder ("TEM-26SS" manufactured by TOSHIBA MACHINE CO., LTD., at a barrel temperature of 310° C. under a nitrogen gas stream) to prepare a mesophase pitch composition. The dispersion diameter of the mesophase pitch in the thermoplastic resin was 0.05 to 2 μm. Also, this mesophase pitch composition was held at 300° C. for 10 minutes, but aggregation of the mesophase pitch was not observed and the dispersion diameter was 0.05 to 2 μm.

Then, this mesophase pitch composition was molded into a 60 μm-thick planar body using a rectangular nozzle with a slit width of 0.2 mm, a slit length of 100 mm and an introduction angle of 60°. The nozzle temperature was 340° C., the discharge amount was 2.4 kg/hour, the shear rate was 1000 s⁻¹, the draft ratio as a ratio of the discharge linear velocity and the take-up rate was 25, and the distance from the discharge port to the cooling drum was 50 mm. Under the conditions, the extension strain rate inside the nozzle was 95 s⁻¹, and the extension strain rate outside the nozzle was 208 s⁻¹. The resulting planar body was disposed in a nonwoven fabric form on a wire gauze having an aperture of 1.46 mm and a wire diameter of 0.35 mm in such a manner that the basis weight of staple fibers was 30 g/m².

A nonwoven fabric including this resin composite fiber was held in a hot air dryer at 215° C. for 3 hours to prepare a nonwoven fabric including a resin composite stabilized fiber. Next, this nonwoven fabric was placed in a vacuum gas replacement furnace, the inside of the furnace was replaced with nitrogen, then decompressed to 1 kPa, and heated in this state to remove the thermoplastic resin. As heating conditions, the temperature was raised to 500° C. at a heating rate of 5° C./min, and then kept at the same temperature for 60 minutes.

The nonwoven fabric freed of the thermoplastic resin was added in an ethanol solvent, and vibrations were applied by an ultrasonic oscillator for 30 minutes to disperse the stabilized fiber in the solvent. The stabilized fiber dispersed in the solvent was filtered to prepare a nonwoven fabric with a stabilized fiber dispersed therein.

The nonwoven fabric with a stabilized fiber dispersed therein was heated to 1000° C. at 5° C./min under a nitrogen gas flow in a vacuum gas replacement furnace, heat-treated at the same temperature for 0.5 hours, and then cooled to room temperature. Further, this nonwoven fabric was placed in a graphite crucible, and heated in vacuum from room temperature to 2000° C. at 10° C./min, using an ultrahigh-temperature furnace (manufactured by Kurata Giken Co., Ltd., model: SCC-U-80/150, soaking section: 80 mm (diameter)×150 mm (height)). After reaching 2000° C., the atmosphere was changed to an argon gas (99.999%) atmosphere at 0.05 MPa (gauge pressure), then the temperature was raised to 3000° C. at a heating rate of 10° C./min and heat-treated at 3000° C. for 0.5 hour. An electron micrograph of the obtained fibrous carbon is shown in FIG. 1.

The fiber diameter of the fibrous carbon obtained by passing through a graphitizing treatment as described above was 150 to 600 nm (average fiber diameter of 280 nm), the ratio (L/D) of the average effective fiber length (L) to the average fiber diameter (D) was 60, and the fibrous carbon had no branch (degree of branching: 0.01/μm or less), and was quite excellent in dispersibility. Also, from the results of measurement by an X-ray diffraction method, the ultrafine fibrous carbon had a lattice spacing (d 002) of 0.3370 nm, a crystallite length (La) of 336.3 nm, and a thickness (Lc) of a net plane group of 66.7 nm, and thus the fibrous carbon had high crystallinity. In addition, the powder volume resistivity when packed at a packing density of 0.4 g/cm³ was 0.14Ω·cm.

EXAMPLE 1

Using N-methyl-2-pyrrolidone as a solvent, polyvinylidene fluoride (manufactured by Kureha Corporation) was dissolved in this solvent so that the concentration of the binder was 10% by mass. Then, the fibrous carbon (Manufacturing Example 1) was added to this solution and kneaded to obtain a slurry. The blending amount of the fibrous carbon was set to 50% by mass with respect to the total amount of the polymer and the fibrous carbon. This slurry was poured onto a polytetrafluoroethylene (PTFE) film and molded to a thickness of 0.3 mm by a doctor blade method at a casting speed of 0.5 cm/min. After heat treatment at 80° C. for 1 hour, heat treatment was further performed at 150° C. for 2 hours to obtain a heat dissipation sheet with a length of 200 cm, a width of 150 cm, and a thickness of 0.1 mm. This heat dissipation sheet had a smooth and supple surface. Values of the thermal conductivity in the in-plane direction (MD direction) and thickness direction of the heat dissipation sheet are shown in Table 1.

Example 2

The same procedure as in Example 1 was carried out except that the blending amount of the fibrous carbon was 25% by mass to obtain a heat dissipation sheet. Values of the thermal conductivity in the in-plane direction (MD direction) and thickness direction of the heat dissipation sheet are shown in Table 1.

Example 3

The same procedure as in Example 1 was carried out except that the blending amount of the fibrous carbon was 10% by mass to obtain a heat dissipation sheet. Values of the thermal conductivity in the in-plane direction (MD direction) and thickness direction of the heat dissipation sheet are shown in Table 1.

Comparative Example 1

The same procedure as in Example 1 was carried out except for using a pitch-based carbon fiber ("Raheama" manufactured by Teijin Ltd., aspect ratio 15, La=212) with an average fiber diameter of 10 μm and an average fiber length of 150 μm as the fibrous carbon to obtain a heat dissipation sheet. Values of the thermal conductivity in the in-plane direction (MD direction) and thickness direction of the heat dissipation sheet are shown in Table 1.

Comparative Example 2

The same procedure as in Example 2 was carried out except for using a pitch-based carbon fiber ("Raheama" manufactured by Teijin Ltd., aspect ratio 15, La=212) with an average fiber diameter of 10 μm and an average fiber length of 150 μm as the fibrous carbon to obtain a heat dissipation sheet. Values of the thermal conductivity in the in-plane direction (MD direction) and thickness direction of the heat dissipation sheet are shown in Table 1. Since the average fiber diameter and the aspect ratio are small, the thermal conductivity is low for the high degree of orientation.

Comparative Example 3

The same procedure as in Example 1 was carried out except for using a vapor-grown carbon fiber (manufactured by Showa Denko K.K., La=40 nm) with an average fiber diameter of 160 nm and an average fiber length of 6 μm as the fibrous carbon to obtain a heat dissipation sheet. Values of the thermal conductivity in the in-plane direction (MD direction) of the heat dissipation sheet are shown in Table 1.

Comparative Example 4

The same procedure as in Example 2 was carried out except for using a vapor-grown carbon fiber (manufactured by Showa Denko K.K., La=40 nm) with an average fiber diameter of 160 nm and an average fiber length of 6 μm as the fibrous carbon to obtain a heat dissipation sheet. Values of the thermal conductivity in the in-plane direction (MD direction) of the heat dissipation sheet are shown in Table 1. Since the fibrous carbon has a small average fiber diameter, it was difficult to orient the fibrous carbon to the plane, and an aggregate of vapor-grown carbon fibers was observed.

Comparative Example 5

The same procedure as in Example 1 was carried out except for using acetylene black with an average particle diameter of 50 nm (manufactured by Denka Company Limited) in place of the fibrous carbon to obtain a heat dissipation sheet. Values of the thermal conductivity in the in-plane direction (MD direction) of the heat dissipation sheet are shown in Table 1.

Comparative Example 6

The same procedure as in Example 2 was carried out except for using acetylene black with an average particle diameter of 50 nm (manufactured by Denka Company Limited) in place of the fibrous carbon to obtain a heat dissipation sheet. Values of the thermal conductivity in the in-plane direction (MD direction) of the heat dissipation sheet are shown in Table 1.

TABLE 1

|  | Fibrous carbon | Concentration of fibrous carbon with respect to total amount of polymer and fibrous carbon (% by mass) | Degree of orientation in MD direction of fibrous carbon in heat dissipation sheet (%) | Thermal conductivity in in-plane direction (MD direction) of heat dissipation sheet (W/m · K) | Thermal conductivity in thickness direction of heat dissipation sheet (W/m · K) |
|---|---|---|---|---|---|
| Example 1 | Carbon fiber of Manufacturing Example 1 | 50 | 85 | 49.50 | 0.35 |
| Example 2 | Carbon fiber of Manufacturing Example 1 | 25 | 81 | 25.21 | 0.30 |
| Example 3 | Carbon fiber of Manufacturing Example 1 | 10 | — | 11.33 | 0.20 |
| Comparative Example 1 | Raheama | 50 | — | 29.27 | — |
| Comparative Example 2 | Raheama | 25 | 88 | 12.07 | — |
| Comparative Example 3 | Vapor-grown carbon fiber | 50 | — | 15.25 | — |

TABLE 1-continued

| | Fibrous carbon | Concentration of fibrous carbon with respect to total amount of polymer and fibrous carbon (% by mass) | Degree of orientation in MD direction of fibrous carbon in heat dissipation sheet (%) | Thermal conductivity in in-plane direction (MD direction) of heat dissipation sheet (W/m · K) | Thermal conductivity in thickness direction of heat dissipation sheet (W/m · K) |
|---|---|---|---|---|---|
| Comparative Example 4 | Vapor-grown carbon fiber | 25 | 70 | 8.68 | — |
| Comparative Example 5 | Acetylene black | 50 | — | 4.89 | — |
| Comparative Example 6 | Acetylene black | 25 | — | 2.99 | — |

Example 4

Using N-methyl-2-pyrrolidone as a solvent, polyvinylidene fluoride (manufactured by Kureha Corporation) was dissolved in this solvent. Then, the fibrous carbon (Manufacturing Example 1) and MCMB particles (particle diameter 10 to 20 μm, manufactured by OSAKA GAS CO., LTD) were added to this solution, and the mixture was kneaded to obtain a slurry. The blending amount of the fibrous carbon was set to 50% by mass with respect to the total amount of the solvent and the fibrous carbon. This slurry was poured onto a PTFE film and molded to a thickness of 0.5 mm by a doctor blade method. After heat treatment at 80° C. for 1 hour, heat treatment was further performed at 150° C. for 2 hours to obtain a heat dissipation sheet. The fibrous carbon was oriented in the in-plane direction (MD direction) of the heat dissipation sheet. The blending amount of each component with respect to the mass of the heat dissipation sheet is 45% by mass of the fibrous carbon, 5% by mass of the MCMB particles, and 50% by mass of the polyvinylidene fluoride.

Example 5

The same procedure as in Example 4 was carried out except that the blending amount of each component with respect to the mass of the heat dissipation sheet was changed to 25% by mass of the fibrous carbon, 25% by mass of the MCMB particles, and 50% by mass of the polyvinylidene fluoride, respectively, to obtain a heat dissipation sheet.

Example 6

The same procedure as in Example 4 was carried out except that the blending amount of each component with respect to the mass of the heat dissipation sheet was changed to 5% by mass of the fibrous carbon, 45% by mass of the MCMB particles, and 50% by mass of the polyvinylidene fluoride, respectively, to obtain a heat dissipation sheet.

Comparative Example 7

The same procedure as in Example 4 was carried out except for using 5% by mass of acetylene black particles (particle diameter 50 to 100 nm, manufactured by Denka Company Limited) in place of MCMB to obtain a heat dissipation sheet.

Comparative Example 8

The same procedure as in Example 5 was carried out except for using 25% by mass of acetylene black particles (particle diameter 50 to 100 nm, manufactured by Denka Company Limited) in place of MCMB to obtain a heat dissipation sheet.

Comparative Example 9

The same procedure as in Example 6 was carried out except for using 45% by mass of acetylene black particles (particle diameter 50 to 100 nm, manufactured by Denka Company Limited) in place of MCMB to obtain a heat dissipation sheet.

Comparative Example 10

The same procedure as in Example 4 was carried out except for using 5% by mass of boron nitride particles (particle diameter 150 nm, manufactured by Sigma-Aldrich Japan K.K.) in place of MCMB to obtain a heat dissipation sheet.

Comparative Example 11

The same procedure as in Example 5 was carried out except for using 25% by mass of boron nitride particles (particle diameter 150 nm, manufactured by Sigma-Aldrich Japan K.K.) in place of MCMB to obtain a heat dissipation sheet.

Comparative Example 12

The same procedure as in Example 6 was carried out except for using 45% by mass of boron nitride particles (particle diameter 150 nm, manufactured by Sigma-Aldrich Japan K.K.) in place of MCMB to obtain a heat dissipation sheet.

Reference Example 1

The same procedure as in Example 4 was carried out except that the blending amount of each component with respect to the mass of the heat dissipation sheet was changed to 10% by mass of the fibrous carbon, 0% by mass of the MCMB particles, and 90% by mass of the polyvinylidene fluoride, respectively, to obtain a heat dissipation sheet.

Reference Example 2

The same procedure as in Example 4 was carried out except that the blending amount of each component with respect to the mass of the heat dissipation sheet was changed to 25% by mass of the fibrous carbon, 0% by mass of the MCMB particles, and 75% by mass of the polyvinylidene fluoride, respectively, to obtain a heat dissipation sheet.

Reference Example 3

The same procedure as in Example 4 was carried out except that the blending amount of each component with respect to the mass of the heat dissipation sheet was changed to 50% by mass of the fibrous carbon, 0% by mass of the MCMB particles, and 50% by mass of the polyvinylidene fluoride, respectively, to obtain a heat dissipation sheet.

sheet had a smooth, flat and supple surface. Observation and photographing of the surface of this heat dissipation sheet were performed using a scanning electron microscope (S-2400, manufactured by Hitachi, Ltd.). This micrograph is shown in FIG. 3. The mechanical properties of this heat dissipation sheet are shown in Table 3. Further, the thermal conductivity in the in-plane direction of this heat dissipation sheet is shown in Table 4.

TABLE 2

| | Mass of fibrous carbon (wt %) | Mass of MCMB (wt %) | Mass of AB (wt %) | Mass of BN (wt %) | Thermal conductivity in thickness direction (W/m · K) | Thermal conductivity in fiber axis direction (W/m · K) |
|---|---|---|---|---|---|---|
| Example 4 | 45 | 5 | — | — | 4.07 | 63.45 |
| Example 5 | 25 | 25 | — | — | 6.82 | 32.55 |
| Example 6 | 5 | 45 | — | — | 8.56 | 15.26 |
| Comparative Example 7 | 45 | — | 5 | — | 0.82 | 22.23 |
| Comparative Example 8 | 25 | — | 25 | — | 0.84 | 10.34 |
| Comparative Example 9 | 5 | — | 45 | — | 0.88 | 6.62 |
| Comparative Example 10 | 45 | — | — | 5 | 1.09 | 52.03 |
| Comparative Example 11 | 25 | — | — | 25 | 1.34 | 33.42 |
| Comparative Example 12 | 5 | — | — | 45 | 1.60 | 15.46 |
| Reference Example 1 | 10 | — | — | — | 0.17 | 11.33 |
| Reference Example 2 | 25 | — | — | — | 0.29 | 25.21 |
| Reference Example 3 | 50 | — | — | — | 0.31 | 49.50 |

According to the present invention, the particle diameter contains filler particles with a size of 1 to 150 times the average fiber diameter of the fibrous carbon. Therefore, it is inferred that an appropriate thermal conduction path is formed in the thickness direction between the carbon fibers and the filler particles. Therefore, a heat dissipation sheet with improved thermal conductivity in the thickness direction while maintaining a good thermal conductivity in one direction (usually MD direction (fiber axis direction)) in which the degree of orientation in the in-plane direction of the fibrous carbon is the highest is provided. On the other hand, it is inferred that since the fillers of Comparative Examples 1 to 6 are smaller in particle diameter than the fiber diameter, they are buried between the fibers, a thermal conduction path is not effectively formed, and the thermal conductivity in the thickness direction hardly increases.

Example 7

Using N-methyl-2-pyrrolidone as a solvent, polyamide ("Technora" (registered trademark) manufactured by Teijin Limited) was dissolved in this solvent. Then, the fibrous carbon (Manufacturing Example 1) was added to this solution and kneaded to obtain a slurry. The blending amount of the fibrous carbon was set to 30% by mass with respect to the total amount of the solvent and the fibrous carbon. This slurry was poured onto a heat-resistant glass and molded into a thickness of 0.1 mm by a doctor blade method. After heat treatment at 80° C. for 1 hour, heat treatment was further performed at 150° C. for 3 hours to obtain a heat dissipation sheet with a length of 200 cm, a width of 150 cm, and a thickness of 0.05 mm. The obtained heat dissipation

Example 8

The same procedure as in Example 7 was carried out except that the blending amount of the fibrous carbon was 5% by mass, and 20% by mass of a pitch-based carbon fiber ("Raheama" manufactured by Teijin Ltd., aspect ratio 15, La=212) with an average fiber diameter of 10 μm and an average fiber length of 150 μm was further blended so that the blending amount was 25% by mass with respect to the total amount of the solvent and the fibrous carbon to obtain a heat dissipation sheet. Values of the thermal conductivity in the in-plane direction (MD direction) of the heat dissipation sheet are shown in Table 4.

Example 9

The same procedure as in Example 7 was carried out except that the blending amount of the fibrous carbon was 12.5% by mass, and 12.5% by mass of a pitch-based carbon fiber ("Raheama" manufactured by Teijin Ltd., aspect ratio 15, La=212) with an average fiber diameter of 10 μm and an average fiber length of 150 μm was further blended so that the blending amount was 25% by mass with respect to the total amount of the solvent and the fibrous carbon to obtain a heat dissipation sheet. Values of the thermal conductivity in the in-plane direction (MD direction) of the heat dissipation sheet are shown in Table 4.

Example 10

The same procedure as in Example 7 was carried out except that the blending amount of the fibrous carbon was 20% by mass, and 5% by mass of a pitch-based carbon fiber ("Raheama" manufactured by Teijin Ltd., aspect ratio 15, La=212) with an average fiber diameter of 10 μm and an average fiber length of 150 μm was further blended so that the blending amount was 25% by mass with respect to the total amount of the solvent and the fibrous carbon to obtain a heat dissipation sheet. Values of the thermal conductivity in the in-plane direction (MD direction) of the heat dissipation sheet are shown in Table 4.

Example 11

The same procedure as in Example 7 was carried out except that the blending amount of the fibrous carbon was 10% by mass with respect to the total amount of the solvent and the carbon fiber (CNF) to obtain a heat dissipation sheet. Values of the thermal conductivity in the in-plane direction (MD direction) of the heat dissipation sheet are shown in Table 4.

Comparative Example 13

The same procedure as in Example 7 was carried out except that 10% by mass of a pitch-based carbon fiber ("Raheama" (registered trademark) manufactured by Teijin Ltd.) with an average fiber diameter of 10 μm and an average fiber length of 150 μm was blended as the fibrous carbon to obtain a heat dissipation sheet. Values of the thermal conductivity in the in-plane direction (MD direction) of the heat dissipation sheet are shown in Table 4. Unevenness was observed over the entire surface of the obtained heat dissipation sheet. Observation and photographing of the surface of this heat dissipation sheet were performed using a scanning electron microscope (S-2400, manufactured by Hitachi, Ltd.). This micrograph is shown in FIG. 4. The mechanical properties of this heat dissipation sheet are shown in Table 3. Further, values of the thermal conductivity in the in-plane direction (MD direction) of the heat dissipation sheet are shown in Table 4.

Reference Example 4

The same procedure as in Example 7 was carried out except for using a vapor-grown carbon fiber (manufactured by Showa Denko K.K., La=40 nm) with an average fiber diameter of 160 nm and an average fiber length of 6 μm as the fibrous carbon to obtain a heat dissipation sheet. The mechanical properties of this heat dissipation sheet are shown in Table 3.

TABLE 3

|  | Example 7 | Comparative Example 13 | Reference Example 4 |
|---|---|---|---|
| Elongation at break (%) | 1.0 | 0.93 | 0.97 |
| Breaking stress (MPa) | 1.0 | 0.95 | 0.97 |
| Modulus of elasticity (MPa) | 1.0 | 1.0 | 0.93 |

TABLE 4

|  | Carbon fiber content (% by mass) | | Sheet thickness | Thermal conductivity in in-plane direction |
|---|---|---|---|---|
|  | CNF | Raheama | (μm) | (W · m$^{-1}$ · K$^{-1}$) |
| Example 7 | 30 |  | 50 | 43.54 |
| Example 8 | 5 | 25 | 50 | 16.07 |
| Example 9 | 12.5 | 12.5 | 50 | 19.64 |
| Example 10 | 20 | 5 | 50 | 24.19 |
| Example 11 | 10 |  | 50 | 17.03 |
| Comparative Example 13 |  | 10 | 50 | 5.2 |

Example 12

Using N-methyl-2-pyrrolidone as a solvent, polyamide ("Technora" (registered trademark) manufactured by Teijin Limited) was dissolved in this solvent so that the concentration of the binder was 6% by mass. Then, the fibrous carbon (Manufacturing Example 1) was added to this solution and kneaded to obtain a slurry. The blending amount of the fibrous carbon was set to 30% by mass with respect to the total amount of the solvent and the fibrous carbon. This slurry was poured onto a heat-resistant glass and molded into a thickness of 0.3 mm by a doctor blade method. After heat treatment at 80° C. for 1 hour, heat treatment was further performed at 150° C. for 3 hours to obtain a heat dissipation sheet with a length of 200 cm, a width of 150 cm, and a thickness of 0.05 mm. This heat dissipation sheet had a smooth and supple surface. The form of the vicinity of the surface and the inside of this heat dissipation sheet was observed with a scanning electron microscope (S-2400, manufactured by Hitachi, Ltd.) (3,000 times). The fibrous carbon was oriented in parallel to the in-plane of the sheet in the vicinity of the surface, and the fibrous carbon was randomly oriented three-dimensionally in the inside (central part). Here, the vicinity of the surface in the depth direction of the heat dissipation sheet refers to a region from the surface to a depth of 20% with respect to the thickness.

Values of the thermal conductivity in the in-plane direction (MD direction) of the heat dissipation sheet are shown in Table 5.

Example 13

The same procedure as in Example 12 was carried out except that the thickness of the heat dissipation sheet was 0.12 mm to obtain a heat dissipation sheet. Values of the thermal conductivity in the in-plane direction (MD direction) of the heat dissipation sheet are shown in Table 5.

Reference Examples 4, 5

The same procedure as in Examples 12, 13 was carried out except that the content of the fibrous carbon was 10% by mass to each obtain a heat dissipation sheet (Reference Example 4 had a thickness of 50 μm, and Reference Example 5 had a thickness of 120 μm). Values of the thermal conductivity in the in-plane direction (MD direction) of the heat dissipation sheet are shown in Table 5.

TABLE 5

| | CNF Content (% by mass) | Thermal conductivity in in-plane direction (W · m$^{-1}$ · K$^{-1}$) |
|---|---|---|
| Example 12 | 30 | 43.54 |
| Example 13 | 30 | 42.54 |
| Reference Example 4 | 10 | 17.03 |
| Reference Example 5 | 10 | 11.33 |

When the CNF content was small, the thermal conductivity was higher when the film was thin (Reference Examples 4 to 5).

Manufacturing Example 2

The fibrous carbon of Manufacturing Example 1 was ground to prepare fibrous carbon (S-CNF) having a short fiber length. The average effective fiber length was 6.0 μm. The average fiber diameter is the same as that of Manufacturing Example 1.

Example 14

Using N-methyl-2-pyrrolidone as a solvent, polyamide ("CONEX" (registered trademark) manufactured by Teijin Limited) was dissolved in this solvent so that the concentration of the binder was 16% by mass. Then, the fibrous carbon (Manufacturing Example 2) was added to this solution and kneaded to obtain a slurry. The blending amount of the fibrous carbon was set to 30% by mass with respect to the total amount of the solvent and the fibrous carbon. This slurry was poured onto a PTFE film and molded to a thickness of 0.1 mm by a doctor blade method. After heat treatment at 80° C. for 1 hour, heat treatment was further performed at 150° C. for 3 hours to obtain a heat dissipation sheet with a length of 200 cm, a width of 150 cm, and a thickness of 0.05 mm. Values of the thermal conductivity in the in-plane direction (MD direction) of this heat dissipation sheet are shown in Table 6.

Example 15

The same procedure as in Example 14 was carried out except for using the fibrous carbon of Manufacturing Example 1 in place of the fibrous carbon (S-CNF) of Manufacturing Example 2 to obtain a heat dissipation sheet. Values of the thermal conductivity in the in-plane direction and thickness direction of the heat dissipation sheet are shown in Table 6.

Reference Example 6

The same procedure as in Example 14 was carried out except for using a pitch-based carbon fiber ("Raheama" manufactured by Teijin Ltd., aspect ratio 15, La=212) with an average fiber diameter of 10 μm and an average fiber length of 150 μm in place of the fibrous carbon (S-CNF) of Manufacturing Example 2 to obtain a heat dissipation sheet. The thermal conductivity in the in-plane direction and thickness direction of the obtained heat dissipation sheet is shown in Table 6.

Example 16

The same procedure as in Example 14 was carried out except that the blending amount of the fibrous carbon (S-CNF) was changed to 50% by mass to obtain a heat dissipation sheet. The thermal conductivity in the thickness direction of the obtained heat dissipation sheet is shown in Table 6.

Example 17

The same procedure as in Example 14 was carried out except that the blending amount of the fibrous carbon (S-CNF) was changed to 70% by mass to obtain a heat dissipation sheet. The thermal conductivity in the thickness direction of the obtained heat dissipation sheet is shown in Table 6.

Example 18

The same procedure as in Example 14 was carried out except that the blending amount of the fibrous carbon (S-CNF) was changed to 10% by mass and 30% by mass of boron nitride particles (manufactured by Sigma-Aldrich Japan K.K., particle diameter 150 nm) was further added to obtain a heat dissipation sheet. The thermal conductivity in the thickness direction of the obtained heat dissipation sheet is shown in Table 6.

Example 19

The same procedure as in Example 14 was carried out except that the blending amount of the fibrous carbon (S-CNF) was changed to 30% by mass and 30% by mass of boron nitride particles (manufactured by Sigma-Aldrich Japan K.K., particle diameter 150 nm) was further added to obtain a heat dissipation sheet. The thermal conductivity in the thickness direction of the obtained heat dissipation sheet is shown in Table 6.

TABLE 6

| | Carbon fiber content (% by mass) | | | | Thermal conductivity (W · m$^{-1}$ · K$^{-1}$) | |
|---|---|---|---|---|---|---|
| | S-CNF | CNF | Raheama | BN | In-plane direction | Thickness direction |
| Example 14 | 30 | | | | 16.27 | 0.41 |
| Example 15 | | 30 | | | 42.54 | 0.34 |
| Reference Example 6 | | | 30 | | 20 | 0.33 |
| Example 16 | 50 | | | | Unmeasured | 0.394 |
| Example 17 | 70 | | | | Unmeasured | 0.402 |
| Example 18 | 30 | | | 10 | Unmeasured | 1.7 |
| Example 19 | 30 | | | 30 | Unmeasured | 1.02 |

Manufacturing Example 3

The same procedure as in Manufacturing Example 1 was carried out except that the graphitization treatment temperature was 1500° C. to manufacture low-temperature graphitized fibrous carbon. This low-temperature graphitized carbon fiber had a fiber diameter of 150 to 450 nm (average fiber diameter of 250 nm) and an average effective fiber length of 68 μm. The ratio (L/D) of the average effective fiber length (L) to the average fiber diameter (D) was 272, and the carbon fiber had no branch (degree of branching: 0.01/μm or less), and was quite excellent in dispersibility. Also, from the results of measurement by an X-ray diffraction method, the carbon fiber had a lattice spacing (d 002) of 0.34310 nm, a crystallite length (La) of measuring lower limit or less, and a thickness (Lc) of a net plane group of 10 nm.

Example 20

Using N-methyl-2-pyrrolidone as a solvent, polyamide ("CONEX" (registered trademark) manufactured by Teijin Limited) was dissolved in this solvent so that the concentration of the binder was 16% by mass. Then, the low-temperature graphitized fibrous carbon (Manufacturing Example 3) was added to this solution and kneaded to obtain a slurry. The blending amount of the fibrous carbon was set to 40% by mass with respect to the total amount of the solvent and the fibrous carbon. This slurry was poured onto a heat-resistant glass and molded into a thickness of 0.3 mm by a doctor blade method. After heat treatment at 80° C. for 1 hour, heat treatment was further performed at 150° C. for 3 hours to obtain a heat dissipation sheet with a length of 200 cm, a width of 150 cm, and a thickness of 0.12 mm. Values of the thermal conductivity in the in-plane direction (MD direction) of this heat dissipation sheet are shown in Table 7.

Example 21

The same procedure as in Example 20 was carried out except that the blending amount of the low-temperature graphitized fibrous carbon of Manufacturing Example 3 was changed to 60% by mass to obtain a heat dissipation sheet. The thermal conductivity in the thickness direction of the obtained heat dissipation sheet is shown in Table 7.

Example 22

The same procedure as in Example 20 was carried out except that the blending amount of the low-temperature graphitized fibrous carbon of Manufacturing Example 3 was changed to 10% by mass and 30% by mass of the fibrous carbon of Manufacturing Example 1 was further added to obtain a heat dissipation sheet. The thermal conductivity in the thickness direction of the obtained heat dissipation sheet is shown in Table 7.

Example 23

The same procedure as in Example 20 was carried out except that the blending amount of the low-temperature graphitized fibrous carbon of Manufacturing Example 3 was changed to 30% by mass and 10% by mass of the fibrous carbon of Manufacturing Example 1 was further added to obtain a heat dissipation sheet. The thermal conductivity in the thickness direction of the obtained heat dissipation sheet is shown in Table 7.

TABLE 7

| | Addition amount (% by mass) | | Thermal conductivity $(W \cdot m^{-1} \cdot K^{-1})$ | |
|---|---|---|---|---|
| | Low-temperature graphitized fibrous carbon (Manufacturing Example 3) | Fibrous carbon (Manufacturing Example 1) | In-plane direction | Thickness direction |
| Example 20 | 40 | 0 | 20.9 | 0.41 |
| Example 21 | 60 | 0 | 22.4 | 0.49 |
| Example 22 | 10 | 30 | 22.4 | 0.4 |
| Example 23 | 30 | 10 | 17.2 | 0.41 |

Example 24

An epoxy resin (commercially available product) and the fibrous carbon of Manufacturing Example 1 were mixed. The blending amount of the fibrous carbon was set to 30% by mass with respect to the total amount of the epoxy resin and the fibrous carbon. The mixture was loaded into a syringe and extruded to prepare 30 rod-like molded bodies. The rod-like molded bodies had a length of 100 mm and a diameter of 10 mm. These 30 rod-like molded bodies were bundled, the epoxy resin was further added thereto, and the mixture was heat-treated at 70° C. for 2 hours to obtain one molded body. This molded body was sliced perpendicularly to the fiber axis direction of the molded body and the surface thereof was polished to obtain a sheet of a disc-shaped carbon fiber molded body with a thickness of 0.1 mm and a diameter of 16 mm. The thermal conductivity in the in-plane direction and thickness direction of the obtained sheet of the carbon fiber molded body is shown in Table 8.

Example 25

Thirty filamentous molded bodies of Example 1 were placed in a vertically standing bottle-shaped container with a diameter of 28 mm. Next, using N-methyl-2-pyrrolidone as a solvent, 16% by mass of CONEX (manufactured by Teijin Limited) was dissolved in this solvent. Then, the fibrous carbon of Manufacturing Example 1 was mixed with this solution to obtain a slurry. This slurry was poured into the container and heat-treated at 80° C. for 1 hour and 150° C. for 2 hours. Subsequently, the molded bodies were taken out from the container and sliced perpendicularly to the fiber axis direction of the molded bodies, and the surface thereof was polished to obtain a circular heat dissipation sheet with a thickness of 0.1 mm and a diameter of 18 mm. A sheet of a disc-shaped carbon fiber molded body was obtained. The thermal conductivity in the in-plane direction and thickness direction of the obtained sheet of the carbon fiber molded body is shown in Table 8.

TABLE 8

| | Thermal conductivity $(W \cdot m^{-1} \cdot K^{-1})$ | |
|---|---|---|
| | In-plane direction | Thickness direction |
| Example 24 | 1.35 | 25.4 |
| Example 25 | 13.2 | 26.7 |

Example 26

Using N-methyl-2-pyrrolidone as a solvent, polyamide ("Technora" (registered trademark) manufactured by Teijin Limited) was dissolved in this solvent so that the concentration of the binder was 6% by mass. Then, the fibrous carbon (Manufacturing Example 1) was added to this solution and kneaded to obtain a slurry. The blending amount of the fibrous carbon was set to 30% by mass with respect to the total amount of the solvent and the fibrous carbon. This slurry was poured onto a heat-resistant glass and molded into a thickness of 0.12 mm by a doctor blade method. After heat treatment at 80° C. for 1 hour, heat treatment was further performed at 150° C. for 3 hours to obtain a heat dissipation sheet with a length of 200 cm, a width of 150 cm, and a thickness of 0.05 mm. Values of the thermal conductivity in the in-plane direction (MD direction) of this heat dissipation sheet are shown in Table 9.

Example 27

The same procedure as in Example 26 was carried out except that the blending amount of the fibrous carbon was changed to 50% by mass to obtain a heat dissipation sheet. The thermal conductivity in the thickness direction of the obtained heat dissipation sheet is shown in Table 8.

Example 28

The same procedure as in Example 26 was carried out except that the blending amount of the fibrous carbon was changed to 50% by mass and polyimide ("U imide (registered trademark) varnish AR type" manufactured by UNITIKA LTD.) was used in place of polyamide so that the concentration of the binder was 18% by mass to obtain a heat dissipation sheet. The thermal conductivity in the surface direction of the obtained heat dissipation sheet is shown in Table 9.

Example 29

Using N-methyl-2-pyrrolidone as a solvent, polyamide ("CONEX" (registered trademark) manufactured by Teijin Limited) was dissolved in this solvent so that the concentration of the binder was 16% by mass. Then, the fibrous carbon (Manufacturing Example 1) was added to this solution and kneaded to obtain a slurry. The blending amount of the fibrous carbon was set to 30% by mass with respect to the total amount of the solvent and the fibrous carbon. The same procedure as in Example 26 was carried out except the above to obtain a heat dissipation sheet. The thermal conductivity in the surface direction of the obtained heat dissipation sheet is shown in Table 9.

TABLE 9

| | Binder | | Thermal conductivity (W · m$^{-1}$ · K$^{-1}$) In-plane direction |
|---|---|---|---|
| | Type | Content (% by mass) | |
| Example 26 | Technora | 30 | 12.71 |
| Example 27 | Technora | 50 | 25.25 |
| Example 28 | Polyimide | 50 | 35.68 |
| Example 29 | CONEX | 30 | 42.54 |

Example 30

Using N-methyl-2-pyrrolidone as a solvent, polyamide ("CONEX (registered trademark) manufactured by Teijin Limited) was dissolved in this solvent so that the concentration of the binder was 16% by mass. Then, the fibrous carbon (Manufacturing Example 1) and SiO$_2$ ("Tospearl 120" (trade name), manufactured by Toshiba Silicones, spherical particles with an average particle diameter of 2 μm) as a filler were added to this solution and kneaded to obtain a slurry. The blending amount of the fibrous carbon was set to 20% by mass with respect to the total amount of the solvent, the fibrous carbon, and the filler. The blending amount of the filler was set to 5% by mass with respect to the total amount of the solvent, the fibrous carbon, and the filler. This slurry was poured onto a PTFE film and molded to a thickness of 0.3 mm by a doctor blade method. After heat treatment at 80° C. for 1 hour, heat treatment was further performed at 150° C. for 3 hours to obtain a heat dissipation sheet with a length of 200 cm, a width of 150 cm, and a thickness of 0.12 mm. Values of the thermal conductivity in the in-plane direction (MD direction) of this heat dissipation sheet are shown in Table 10.

Example 31

The same procedure as in Example 30 was carried out except that the blending amount of the fibrous carbon was changed to 5% by mass and the blending amount of SiO$_2$ was changed to 20% by mass to obtain a heat dissipation sheet. The thermal conductivity of the obtained heat dissipation sheet is shown in Table 10.

Example 32

The same procedure as in Example 30 was carried out except that Al$_2$O$_3$ powder (manufactured by Hiroshima Wako Co., Ltd., "reagent grade", average particle diameter 5 μm) was used in place of SiO$_2$ and the blending amount thereof was changed to 5% by mass to obtain a heat dissipation sheet. The thermal conductivity of the obtained heat dissipation sheet is shown in Table 10.

Example 33

The same procedure as in Example 31 was carried out except that Al$_2$O$_3$ powder was used in place of SiO$_2$ to obtain a heat dissipation sheet. The thermal conductivity of the obtained heat dissipation sheet is shown in Table 10.

TABLE 10

| | CNF | Filler | | Thermal conductivity (W · m$^{-1}$ · K$^{-1}$) | |
|---|---|---|---|---|---|
| | (% by mass) | (% by mass) | | In-plane direction | Thickness direction |
| | | SiO$_2$ | Al$_2$O$_3$ | | |
| Example 30 | 20 | 5 | | 19.94 | 0.35 |
| Example 31 | 5 | 20 | | 6.05 | 0.41 |
| Example 32 | 20 | | 5 | 15.88 | 0.36 |
| Example 33 | 5 | | 20 | 5.75 | 0.40 |

Example 34

Using N-methyl-2-pyrrolidone as a solvent, polyamide ("Technora" (registered trademark) manufactured by Teijin Limited) was dissolved in this solvent so that the concentration of the binder was 6% by mass. Then, the fibrous carbon (Manufacturing Example 1) and carbon nanotube ("FloTube 9000" (trade name) manufactured by CNano Technology Limited, an aggregate in which single fibers with an average fiber diameter of 11 nm and an average fiber length of 10 μm are aggregated) was added to this solution as a filler and kneaded to obtain a slurry. The blending amount of the fibrous carbon was set to 30% by mass with respect to the total amount of the solvent, the fibrous carbon, and the filler. The blending amount of the filler was set to 10% by mass with respect to the total amount of the solvent, the fibrous carbon, and the filler. This slurry was poured onto a heat-resistant glass and molded into a thickness of 0.12 mm by a doctor blade method. After heat treatment at 80° C. for 1 hour, heat treatment was further performed at 150° C. for 3 hours to obtain a heat dissipation sheet with a length of 200 cm, a width of 150 cm, and a thickness of 0.05 mm. Values of the thermal conductivity in the in-plane direction and thickness direction of this heat dissipation sheet are shown in Table 11.

Example 35

The same procedure as in Example 34 was carried out except that the blending amount of the fibrous carbon was changed to 30% by mass and the blending amount of CNT was changed to 30% by mass to obtain a heat dissipation sheet. The thermal conductivity of the obtained heat dissipation sheet is shown in Table 11.

Example 36

The same procedure as in Example 34 was carried out except that the blending amount of the fibrous carbon was changed to 30% by mass and the blending amount of CNT was changed to 50% by mass to obtain a heat dissipation sheet. The thermal conductivity of the obtained heat dissipation sheet is shown in Table 11.

TABLE 11

| | Filler addition amount (% by mass) | | Thermal conductivity $(W \cdot m^{-1} \cdot K^{-1})$ | |
|---|---|---|---|---|
| | CNF | CNT | In-plane direction | Thickness direction |
| Example 34 | 30 | 10 | 12.85 | 2.82 |
| Example 35 | 30 | 30 | 15.66 | 4.64 |
| Example 36 | 30 | 50 | 27.4 | 8.2 |

The invention claimed is:

1. A heat dissipation sheet comprising fibrous carbon and a polymer, wherein
the fibrous carbon has an average effective fiber length of 5 to 120 μm, an average fiber diameter of 200 to 900 nm, an average aspect ratio of 30 to 10000, a thickness (Lc) of a net plane group of 1 to 200 nm as measured by an X-ray diffraction method, and a powder volume resistivity of the fibrous carbon when packed at a packing density of 0.4 g/cm³ of 1 Ω·cm or less, and
the content rate of the fibrous carbon 8 to 85% by mass with respect to the total amount of the fibrous carbon and the polymer.

2. The heat dissipation sheet according to claim 1, wherein the degree of orientation A of the fibrous carbon determined by an X-ray diffraction method in one direction which is a direction parallel to a surface of the heat dissipation sheet and shows a highest degree of orientation is 55 to 95%.

3. The heat dissipation sheet according to claim 2, wherein thermal conductivity P in one direction which is a direction parallel to a surface of the heat dissipation sheet and shows a highest degree of orientation is 2 to 200 times thermal conductivity T in a thickness direction of the heat dissipation sheet.

4. The heat dissipation sheet according to claim 1, wherein thermal conductivity P in one direction which is a direction parallel to a surface of the heat dissipation sheet and shows a highest degree of orientation is 2 to 200 times thermal conductivity T in a thickness direction of the heat dissipation sheet.

5. The heat dissipation sheet according to claim 1, further comprising filler particles with an average particle diameter of 1 to 150 times the average fiber diameter of the fibrous carbon in an amount of 5 to 45% by mass with respect to the heat dissipation sheet.

6. The heat dissipation sheet according to claim 5, wherein the filler particles are at least one inorganic substance selected from the group consisting of mesocarbon microbeads (MCMB), boron nitride (BN), silicon carbide (SiC), aluminum nitride (AlN), silicon oxide, silicon, metal particles, titania, silica, and alumina.

7. The heat dissipation sheet according to claim 6, wherein the maximum value of the thermal conductivity in an in-plane direction of the sheet is 1.5 to 50 times the thermal conductivity in a thickness direction of the sheet.

8. The heat dissipation sheet according to claim 5, wherein the maximum value of the thermal conductivity in an in-plane direction of the sheet is 1.5 to 50 times the thermal conductivity in a thickness direction of the sheet.

9. The heat dissipation sheet according to claim 1, wherein the thermal conductivity in a thickness direction of the sheet is 1.0 to 100 times the maximum value of the thermal conductivity in an in-plane direction of the sheet.

10. The heat dissipation sheet according to claim 9, comprising a carbon fiber molded body containing carbon fibers aligned in the thickness direction of the sheet.

11. The heat dissipation sheet according to claim 1, further comprising carbon nanotubes with an average fiber length of 2 to 120 μm and an average fiber diameter of 0.4 to 50 nm in an amount of 1 to 60% by mass with respect to the heat dissipation sheet.

12. The heat dissipation sheet according to claim 1, wherein the fibrous carbon is a pitch-based carbon fiber.

13. The heat dissipation sheet according to claim 1, wherein the fibrous carbon is fibrous carbon with a crystallite length (La) of 20 to 500 nm, as measured by an X-ray diffraction method.

14. The heat dissipation sheet according to claim 1, wherein the thickness of the heat dissipation sheet is in the range of 0.01 to 1 mm.

15. The heat dissipation sheet according to claim 1, wherein the polymer is polyamide.

* * * * *